United States Patent
Cho et al.

(10) Patent No.: US 9,632,334 B2
(45) Date of Patent: Apr. 25, 2017

(54) DISPLAY APPARATUS

(71) Applicant: Samsung Display Co., LTD., Yongin, Gyeonggi-Do (KR)

(72) Inventors: Hyun-Min Cho, Seoul (KR); Jae-Byung Park, Seoul (KR); Jae-Hyun Cho, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 226 days.

(21) Appl. No.: 14/479,418

(22) Filed: Sep. 8, 2014

(65) Prior Publication Data

US 2015/0163928 A1   Jun. 11, 2015

(30) Foreign Application Priority Data

Dec. 10, 2013 (KR) ........................ 10-2013-0153109

(51) Int. Cl.
| | | |
|---|---|---|
| *G09F 13/04* | (2006.01) | |
| *G09F 13/08* | (2006.01) | |
| *G02F 1/01* | (2006.01) | |
| *G02F 1/1335* | (2006.01) | |
| *G02F 1/1345* | (2006.01) | |
| *H05K 1/02* | (2006.01) | |
| *G02F 1/1333* | (2006.01) | |

(52) U.S. Cl.
CPC ........ *G02F 1/0105* (2013.01); *G02F 1/13452* (2013.01); *G02F 1/133608* (2013.01); *G02F 2001/133314* (2013.01); *H05K 1/028* (2013.01)

(58) Field of Classification Search
CPC ............ G02F 1/0105; G02F 1/133608; G02F 1/13452; G02F 2001/133314; H05K 1/028
USPC ................................................ 362/97.1–97.4
See application file for complete search history.

(56) References Cited

U.S. PATENT DOCUMENTS

| | | | |
|---|---|---|---|
| 7,956,975 | B2 | 6/2011 | Choi |
| 8,113,704 | B2 | 2/2012 | Bae et al. |
| 8,134,655 | B2 * | 3/2012 | Yang ................... G02F 1/13452 349/58 |
| 2012/0313889 | A1 | 12/2012 | Chen et al. |

FOREIGN PATENT DOCUMENTS

| | | |
|---|---|---|
| JP | 2002-139731 A | 5/2002 |
| KR | 100728214 B1 | 6/2007 |
| KR | 1020080013311 A | 2/2008 |
| KR | 1020080035351 A | 4/2008 |
| KR | 100983503 B1 | 9/2010 |
| KR | 1020130013041 A | 2/2013 |
| KR | 1020130025114 A | 3/2013 |
| KR | 1020130033571 A | 4/2013 |
| KR | 1020130038759 A | 4/2013 |

(Continued)

*Primary Examiner* — Jason Moon Han
(74) *Attorney, Agent, or Firm* — Cantor Colburn LLP

(57) ABSTRACT

A display apparatus includes a display panel which displays an image, a driving substrate which is disposed adjacent to the display panel in a first direction, and extends in a second direction substantially perpendicular to the first direction, a connecting part connecting the display panel to the driving substrate, and a receiving container which receives the display panel, the driving substrate and the connecting part, where an angle between the display panel and the driving substrate being greater than about 90 degrees and less than about 180 degrees.

11 Claims, 21 Drawing Sheets

(56) References Cited

FOREIGN PATENT DOCUMENTS

| KR | 1020130064422 A | 6/2013 |
|----|-----------------|--------|
| KR | 1020130066844 A | 6/2013 |
| KR | 1020140016698 A | 2/2014 |

\* cited by examiner

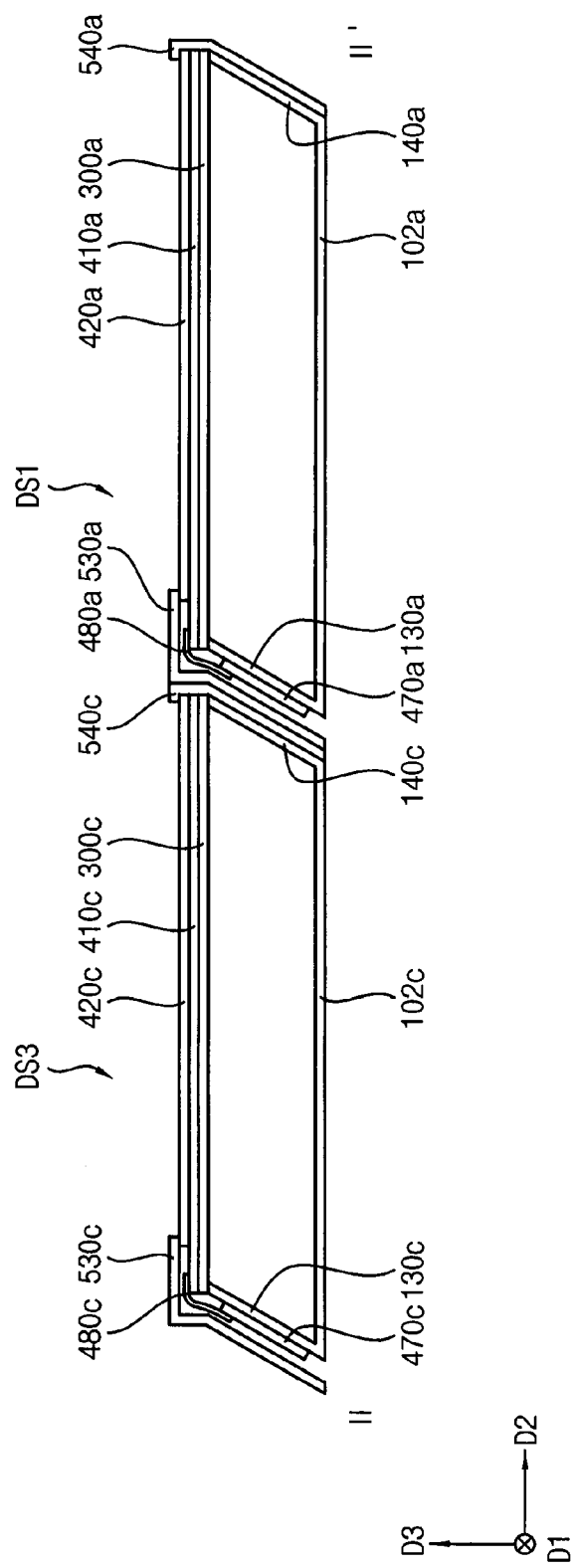

DISPLAY APPARATUS

This application claims priority to Korean Patent Application No. 10-2013-0153109, filed on Dec. 10, 2013, and all the benefits accruing therefrom under 35 U.S.C. §119, the disclosure of which is incorporated by reference herein in its entirety.

BACKGROUND

1. Field

Exemplary embodiments of the invention relate to a display panel.

More particularly, exemplary embodiments of the invention relate to a display apparatus capable of improving a connecting part and a multi-screen display including the display apparatus.

2. Description of the Related Art

Recently, a display apparatus having light weight and small size has been manufactured. A cathode ray tube ("CRT") display apparatus has been used due to a performance and a competitive price. However, the CRT display apparatus has a weakness with a size or portability. Therefore, the liquid crystal display ("LCD") apparatus has been highly regarded due to small size, light weight and low-power-consumption of the LCD apparatus.

The display apparatus generally includes a display panel displaying an image, a driving substrate electrically connected to the display panel to drive the display panel, and a flexible printed circuit film connecting display panel to the driving substrate. The driving substrate is generally disposed in parallel with the display panel and overlaps the display panel, or disposed perpendicular to the display panel.

SUMMARY

A stress concentrated at the flexible printed circuit film may cause a crack of flexible printed circuit film.

In addition, for a multi-screen display which includes a plurality of display apparatuses arranged in a matrix form, a bezel width may be relatively large due to a space for placing the driving substrate.

One or more exemplary embodiment of the invention provides a display apparatus capable of improving a connecting part.

One or more exemplary embodiments of the invention also provide a multi-screen display capable of decreasing a bezel width.

According to an exemplary embodiment of the invention, a display apparatus includes a display panel which displays an image, a driving substrate disposed adjacent to the display panel in a first direction, a connecting part which connects the display panel to the driving substrate, and a receiving container which receives the display panel, the driving substrate and the connecting part. The driving substrate extends in a second direction substantially perpendicular to the first direction. An angle between the display panel and the driving substrate is greater than about 90 degrees and less than about 180 degrees.

In an exemplary embodiment, the receiving container may include a bottom chassis and a top chassis. The bottom chassis may include bottom plate, a first side wall extending from the bottom plate, and a second side wall extending from the bottom plate and facing the first side wall. The top chassis may include a first side surface and a second side surface facing the first side surface in the first direction. The first side surface may include a first inclined surface. The second side surface may include a second inclined surface. The first inclined surface of the top chassis, the driving substrate and the first side wall of the bottom chassis may be in parallel with one another. The second inclined surface of the top chassis and the second side wall of the bottom chassis may be in parallel with each other.

In an exemplary embodiment, an angle between the second side wall and the bottom plate of the bottom chassis may be less than about 90 degrees.

In an exemplary embodiment, the driving substrate may be disposed between the first inclined surface of the top chassis and the first side wall of the bottom chassis.

In an exemplary embodiment, the display apparatus may further include a mold frame which receives the display panel and is received in the receiving container. The mold frame may include a first mold side wall including a first mold inclined surface. The driving substrate may be disposed on the first mold inclined surface. The first mold inclined surface may be in parallel with the first inclined surface of the top chassis.

In an exemplary embodiment, a connecting groove receiving the connecting part may be defined in the first mold side wall and a protrusion disposed on the first inclined surface is provided on the first mold side wall which is configured to support the driving substrate.

In an exemplary embodiment, the driving substrate may be disposed between the first mold side wall of the mold frame and the first side surface of the top chassis.

In an exemplary embodiment, the display panel may be exposed by the driving substrate in a plan view.

In an exemplary embodiment, the connecting part may include a flexible printed circuit film which connects the display panel to the driving substrate and an integrated circuit ("IC") chip disposed on the flexible printed circuit film.

In an exemplary embodiment, the display apparatus may further include a backlight assembly which is disposed under the display panel and received in the receiving container. The backlight assembly may include a reflecting element including a first reflecting side wall, a light source part disposed on the reflecting element.

In an exemplary embodiment, the light source part may include a light source driving substrate and a plurality of light emitting diode ("LED") bars electrically connected to the light source driving substrate.

In an exemplary embodiment, the reflecting element may include a reflecting bottom surface, and a first reflecting side surface extending from the reflecting bottom surface and disposed adjacent to the driving substrate. The driving substrate may be disposed in a space defined by the receiving container, the first reflecting side wall and the driving substrate.

According to another exemplary embodiment of the invention, a display apparatus includes a first display panel displaying an image, a second display panel displaying an image and disposed adjacent to the first display panel in a first direction, a first driving substrate electrically connected to the first display panel and overlapped with the second display panel, a first connecting part connecting the first display panel to the first driving substrate, a first receiving container receiving the first display panel, first driving substrate and the first connecting part, and a second receiving container receiving the second display panel.

In an exemplary embodiment, an angle between the first display panel and the first driving substrate may be greater than about 90 degrees and less than about 180 degrees.

In an exemplary embodiment, each of the first and second receiving containers may include a bottom chassis and a top chassis. The bottom chassis may include a bottom plate, a first side wall extending from the bottom plate, and a second side wall extending from the bottom plate and facing the first side wall. The top chassis may include a first side surface and a second side surface facing the first side surface in the first direction. The first side surface may include a first inclined surface. The second side surface may include a second inclined surface. The first inclined surface of the top chassis, the first driving substrate and the first side wall of the bottom chassis may be in parallel with each other. The second inclined surface of the top chassis and the second side wall of the bottom chassis may be in parallel with each other.

In an exemplary embodiment, the first inclined surface of the top chassis of the first receiving container may make contact with the second inclined surface of the top chassis of the second receiving container.

In an exemplary embodiment, the display apparatus may further include a third display panel which displays an image and disposed adjacent to the third display panel in a second direction which is substantially perpendicular to the first display panel, and a third receiving container receiving the third display panel.

In an exemplary embodiment, the display apparatus may further include a second driving substrate electrically connected to the first display panel and overlapped with the third display panel, and a second connecting part connecting the first display panel to the second driving substrate. The second driving substrate and the second connecting part may be received in the first receiving container.

In an exemplary embodiment, a supporting portion may be protruded from the first inclined surface of the top chassis of the second receiving container. A supporting portion groove which receives the supporting portion may be defined in the second inclined surface of the top chassis of the first receiving container.

In an exemplary embodiment, the display apparatus may further include a third driving substrate electrically connected to the second display panel, and a third connecting part connecting the second display panel to the third driving substrate. The third driving substrate and the third connecting part may be received in the second receiving container.

According to exemplary embodiment of the invention, a display panel includes a display panel and a driving substrate electrically connected to the display panel. An angle between the driving substrate and the display panel is greater than about 90 degrees and less than about 180 degrees, so that a stress concentrated at a connecting part which connecting the driving substrate to the display panel may be decreased.

In addition, a display panel includes a first sub-display apparatus and a second sub-display apparatus. A driving substrate of the first sub-display apparatus is overlapped with a display panel of the second sub-display apparatus, so that a bezel width where an image is not displayed between a display panel of the first sub-display apparatus and a display panel of the second sub-display apparatus may be decreased.

BRIEF DESCRIPTION OF THE DRAWINGS

The above and other features of the invention will become more apparent by describing in detail exemplary embodiments thereof with reference to the accompanying drawings, in which:

FIG. 21 is a cross-sectional view taken along line II-II' of FIG. 19;

DETAILED DESCRIPTION

Figure 1:
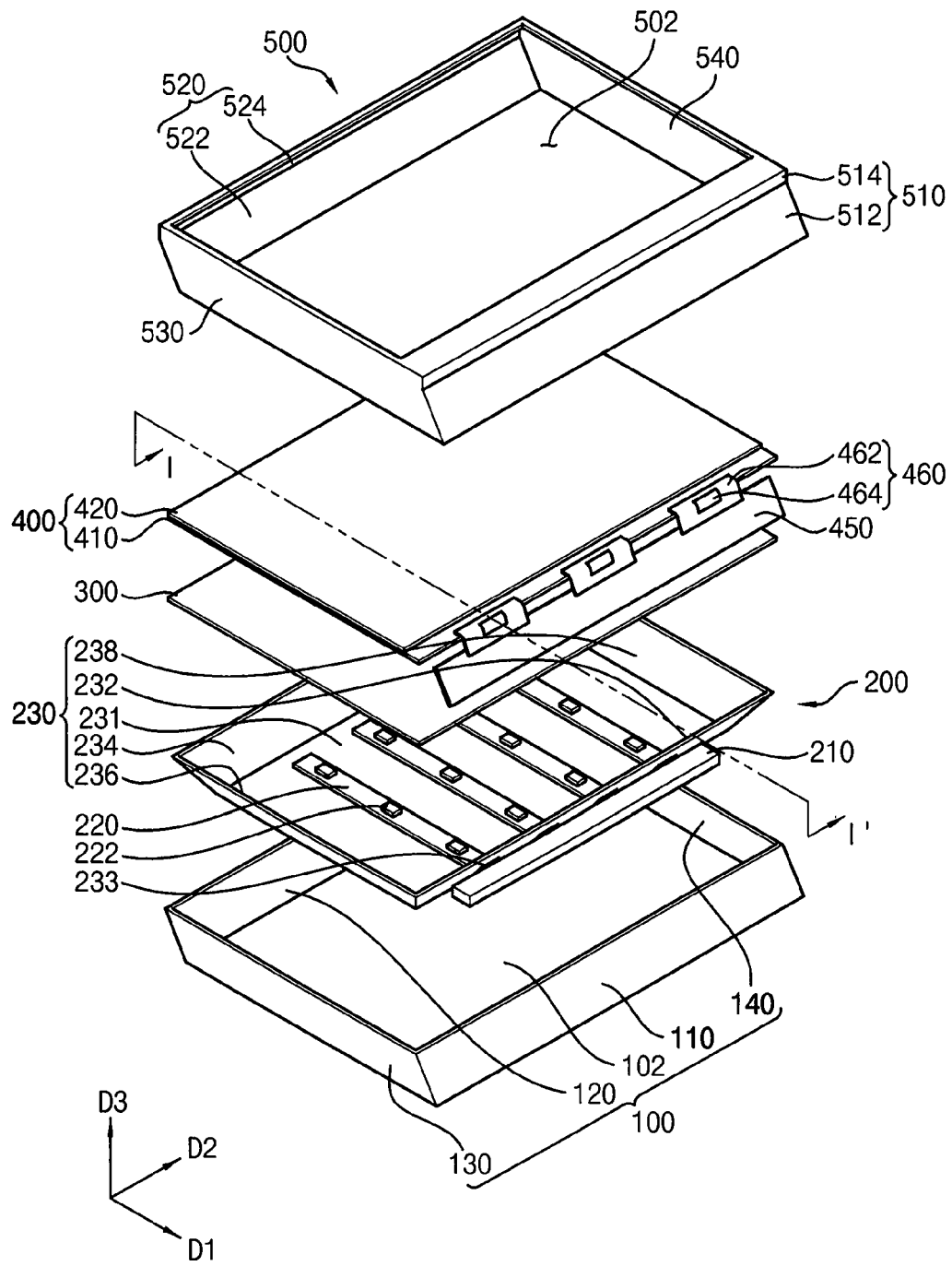
FIG. 1 is an exploded perspective view illustrating an exemplary embodiment of a display apparatus according to the invention.

Hereinafter, the invention will be explained in detail with reference to the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

[The above paragraph may be replaced with the following] Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
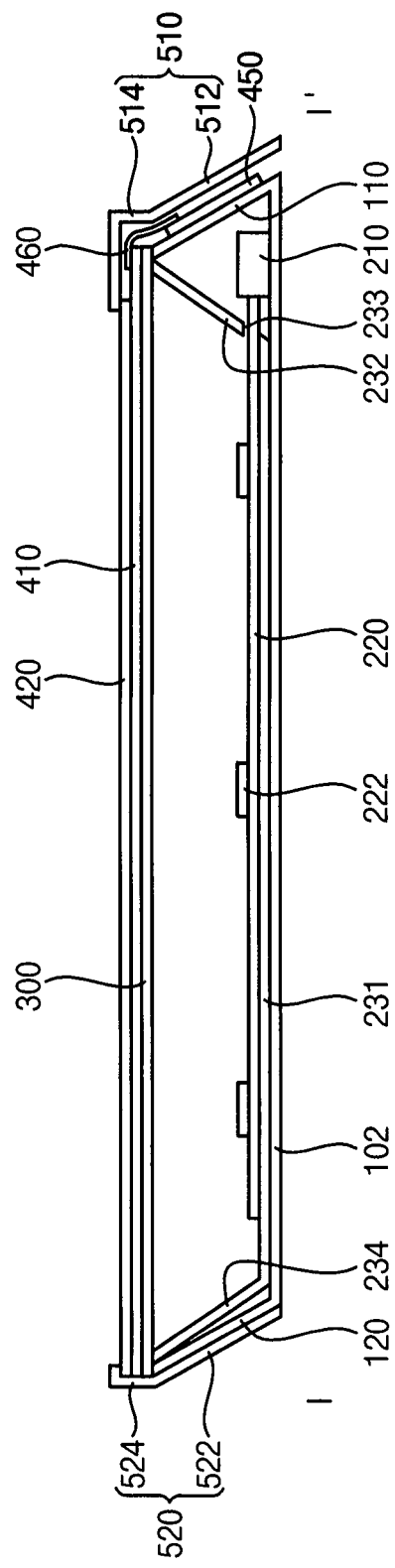
FIG. 2 is a cross-sectional view taken along line I-I' of FIG. 1.

FIG. 1 is an exploded perspective view illustrating a display apparatus according to an exemplary embodiment of the invention. FIG. 2 is a cross-sectional view taken along line I-I' of FIG. 1.

Referring to FIGS. 1 and 2, a display apparatus includes a receiving container including a bottom chassis 100 and a top chassis 500, a backlight assembly 200, an optical element 300, a display panel 400, a driving substrate 450 and a connecting part 460.

The bottom chassis 100 includes a bottom plate 102, a first side wall 110, a second side wall 120, a third side wall 130 and a fourth side wall 140. The first side wall 110 extends from the bottom plate 102. The second side wall 120 extends from the bottom plate 102 and faces the first sidewall 110 in a first direction D1. The third side wall 103 extends from the bottom plate 102 and is connected to the first side wall 110 and the second side wall 120. The fourth side wall 140 extends from the bottom plate 102, is connected to the first side wall 110 and the second side wall 120, and faces the third side wall 130 in a second direction D2 which is substantially perpendicular to the first direction D1.

The first side wall 110 is inclined by a predetermined angle with respect to a third direction D3. The third direction D3 is substantially perpendicular to the first and second directions D1 and D2. Thus, an angle between the first side wall 110 and the bottom plate 102 is less than about 90 degrees.

The second side wall 120 is inclined by a predetermined angle with respect to the third direction D3. Thus, an angle between the second side wall 120 and the bottom plate 102 is about greater than 90 degrees and less than 180 degrees. The second side wall 120 may be in parallel with the first side wall 110.

The third side wall 130 extends from the bottom plate 102 and is perpendicular to the bottom plate 102. Thus, the third side wall 130 extends in the third direction D3. The fourth side wall 140 extends from the bottom plate 102 and is perpendicular to the bottom plate 102. Thus, the fourth side wall 140 extends in the third direction D3. Thus, each of the first and second side walls 110 and 120 has a rectangular shape, and each of the third and fourth side walls 130 and 140 has trapezoid shape.

The backlight assembly 200 is received in the bottom chassis 100, and disposed under the display panel 400. The backlight assembly 200 supplies light to the display panel 400.

The backlight assembly 200 includes a light driving substrate 210, a plurality of light emitting diode ("LED") bars 220 and a reflecting element 230.

The reflecting element 230 includes a reflecting bottom surface 231, a first reflecting side surface 232, a second reflecting side surface 234, a third reflecting side surface 236 and a fourth reflecting side surface 238. The reflecting bottom surface 231 is in parallel with the display panel 400. The first reflecting side surface 232 extends from the reflecting bottom surface 231, and is inclined by a predetermined angle from a center of the display panel 400. The second reflecting side surface 234 extends form the reflecting bottom surface 231, and is inclined by a predetermined angle from a center of the display panel 400, so that the second reflecting side surface 234 faces the first reflecting side surface 232. The third reflecting side surface 236 extends from the reflecting bottom surface 231, and is inclined by a predetermined angle from a center of the display panel 400, so that the third reflecting side surface 236 connects the first reflecting side surface 232 to the second reflecting side surface 234. The fourth reflecting side surface 238 extends from the reflecting bottom surface 231, and is inclined by a predetermined angle from a center of the display panel 400, so that the fourth reflecting side surface 238 faces the third reflecting side surface 236 and connects the first reflecting side surface 232 to the second reflecting side surface 234. A plurality of through holes 233 through which the LED bars 220 are extended is defined through the first reflecting side surface 232.

The light driving substrate 210 is disposed in a space which is defined by the bottom plate 102 and the first side wall 110 of the bottom chassis 100, and the first reflecting side surface 232. The light driving substrate 210 drives the LED bar 220 to generate light.

The LED bar 220 is disposed on the reflecting bottom surface 231 of the reflecting element 230. The LED bar 220 includes a plurality of LED light sources 222 which generates the light. The LED bar 220 is electrically connected to the light driving substrate 210 through the through holes 233 of the first reflecting side surface 232.

The optical element 300 is disposed between the display panel 400 and the backlight assembly 200. Boundaries of the optical element 300 may be supported by the first to fourth side walls 110, 120, 130 and 140.

The optical element 300 may improve optical property of the light from the backlight assembly 200. Thus, the optical element 300 may improve uniform brightness of the light from the backlight assembly 200. In an exemplary embodiment, the optical element 300 may include a plurality of optical sheets. In the exemplary embodiment, optical element 300 may include a protecting sheet, a prism sheet and a diffusion sheet, for example. In an exemplary embodiment, the diffusion sheet may be disposed on the backlight assembly 200, for example. In the exemplary embodiment, the prism sheet may be disposed on the diffusion sheet. In the exemplary embodiment, the protecting sheet may be disposed on the prism sheet. In the exemplary embodiment, the prism sheet may include an upper prism sheet and a lower prism sheet. In the exemplary embodiment, an axis of the upper prism sheet may be substantially perpendicular to an axis of the lower prism sheet. Various modifications of the optical sheet may be possible.

The display panel 400 is disposed on the optical element 300. The display panel 400 includes a lower substrate 410, an upper substrate 420 and a liquid crystal layer (nor shown) between the lower substrate 410 and the upper substrate 420.

The lower substrate 410 may include a plurality of gate lines, a plurality of data lines crossing the gate lines, and a plurality of switching element connected to the gate and data lines. In an exemplary embodiment, the upper substrate 420 may include a black matrix blocking light and a color filter having a color. Although the upper substrate 420 includes the color filter in the illustrated exemplary embodiment, the invention is not limited thereto, and the color filter may be provided in the lower substrate 410. The liquid crystal layer is disposed between the lower substrate 410 and the upper substrate 420. The liquid crystal layer includes liquid crystal molecules having optically anisotropic. The liquid crystal molecules are driven by electric field, so that light may pass through or be blocked by the liquid crystal layer to display an image.

A portion of the lower substrate 410 is exposed at a side of the display panel 400. A plurality of electrode pads is disposed on the exposed portion of the upper substrate 420, so that the electrode pads may be electrically connected to the connecting part 460.

The driving substrate 450 is disposed adjacent to the display panel 400 in the first direction D1. The driving substrate 450 extends in the second direction D2. A driving circuit configured to drive the display panel 400 is disposed on the driving substrate 450. The driving substrate 450 is electrically connected to the display panel 400 through the connecting part 460.

The driving substrate 450 is inclined by a predetermined angle with respect to a plane on which the display panel 400 is disposed. Thus, an angle between the driving substrate 450 and the display panel 400 may be greater than about 90 degrees and less than about 180 degrees. The driving substrate 450 may be disposed on the first side wall 110 of the bottom chassis 100 in parallel with the first side wall 110. In an exemplary embodiment, the driving substrate 450 may be fixed on the first side wall 110 of the bottom chassis 100 by an adhesive such as an adhesive tape, for example. In another exemplary embodiment, the driving substrate 450 may be spaced apart from the first side wall 110 without being fixed on the first side wall 110 of the bottom chassis 100. In another exemplary embodiment, the driving substrate 450 may be spaced apart from the display panel 400 and not overlap the display panel 400.

The connecting part 460 connects the driving substrate 450 to the display panel 400. The connecting part 460 includes a flexible printed circuit film 462 and an integrated circuit ("IC") chip 464. The flexible printed circuit film 462 electrically connects the driving substrate 450 to the electrode pads provided at the exposed portion of the display panel 400. In an exemplary embodiment, the IC chip 464 may be directly mounted on the flexible printed circuit film 462. However, the invention is not limited thereto, and the IC chip 464 may not be directly mounted on the flexible printed circuit film 462.

The angle between the driving substrate 450 and the display panel 400 is greater than about 90 degrees and less than about 180 degrees, so that the connecting part 460 may be bent with a relatively large radius of curvature comparing with a case when the driving substrate 450 is disposed in parallel with or perpendicular to the display panel 400. Accordingly, a stress concentrated at the connecting part 460 may be decreased. Thus, a crack at the flexible printed circuit film 462 of the connecting part 460 may be decreased.

The top chassis 500 includes a first side surface 510, a second side surface 520, a third side surface 530 and a fourth side surface 540. An opening 502 exposing the display panel 400 is defined through the top chassis 500.

The first side surface 510 includes a first inclined surface 512 and a first surface 514. The first surface 514 extends in third direction D3. The first surface 514 corresponds to a boundary of the display panel 400. The first inclined surface 512 extends from the first surface 514, and inclined with respect to the third direction D3. Thus, an angle between the display panel 400 and the first inclined surface 512 may be greater than about 90 degrees and less than about 180 degrees. The first inclined surface 512 may be disposed in parallel with the first side wall 110 of the bottom chassis 100. Thus, the driving substrate 450 may be disposed between the first inclined surface 512 and the first side wall 110.

The second side surface 520 is spaced apart from the first side surface 510 in the first direction D1 to face the first side surface 510. The second side surface 520 includes a second inclined surface 522 and a second surface 524. The second surface 524 extends in the third direction D3. The second surface 524 corresponds to a boundary of the display panel 400. The second inclined surface 522 extends from the second surface 524, and inclined by a predetermined angle with respect to the third direction D3. Thus, an angle between the second inclined surface 522 and the display panel 400 may less than about 90 degrees. The second inclined surface 522 is in parallel with the second side wall 120 of the bottom chassis 100.

The third side surface 530 extends in the first direction D1, and connects the first side surface 510 to the second side surface 520. The third side surface 530 extends in the third direction D3. The fourth side surface 540 extends in the first direction D1, and connects the first side surface 510 to the second side surface 520. The fourth side surface 540 extends in the third direction D3, and faces the third side surface 530 in the second direction D2.

The backlight assembly 200 may be received in the bottom chassis 100. The optical element 300 and the display panel 400 may be disposed on the bottom chassis 100 in which the backlight assembly 200 is received. The driving substrate 450 may be disposed on the first side wall 110 of the bottom chassis 100. The top chassis 500 is combined with the bottom chassis 100 along an inclined direction, so that the top chassis 500 may covered a boundary of the display panel 400 and the driving substrate 450.

For a multi-screen display (refers to FIG. 17) which includes a plurality of display apparatuses continuously disposed, the display apparatus includes a side surface having a trapezoidal shape, so that a space of the display apparatus in which the driving substrate 450 is received overlaps a display panel of an adjacent display apparatus. Thus, a bezel width between the display apparatuses may be decreased.

Figure 3:
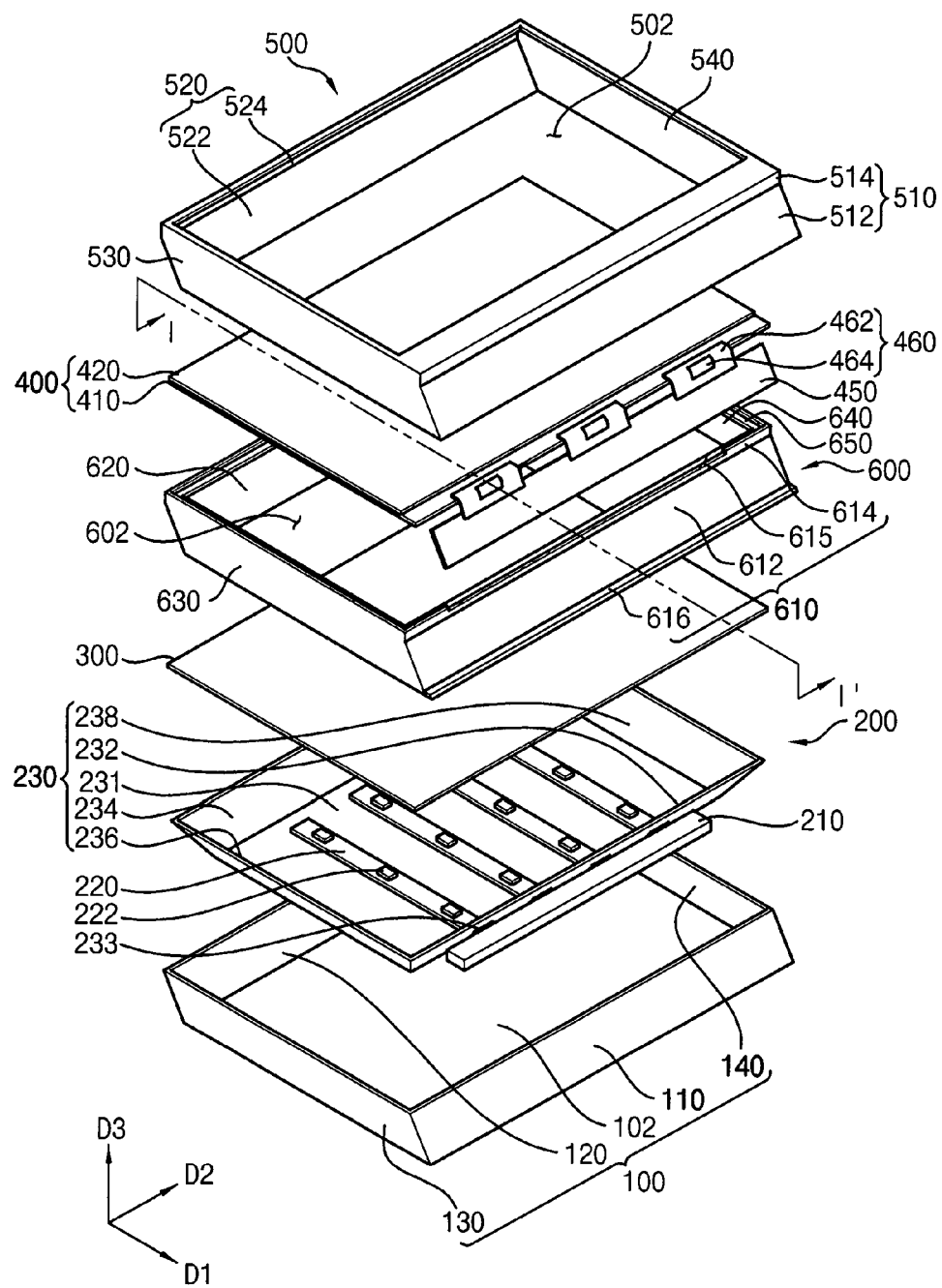
FIG. 3 is an exploded perspective view illustrating another exemplary embodiment of a display apparatus according to the invention.
Figure 4:
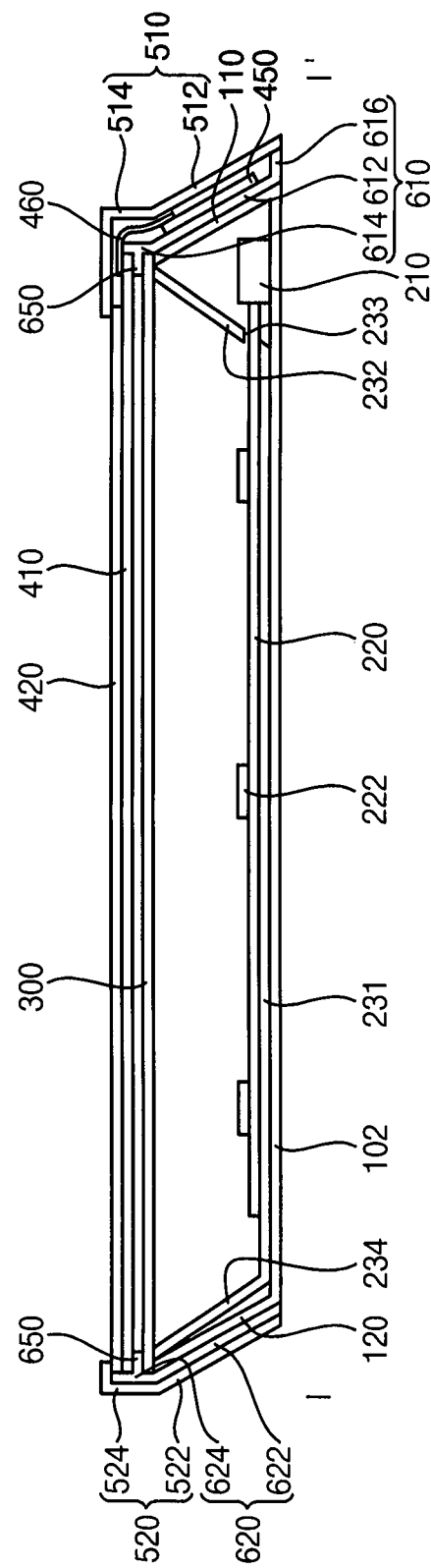
FIG. 4 is a cross-sectional view taken along line I-I' of FIG. 3.

FIG. 3 is an exploded perspective view illustrating a display apparatus according to another exemplary embodiment of the invention. FIG. 4 is a cross-sectional view taken along line I-I' of FIG. 3.

Referring to FIGS. 3 and 4, a display apparatus is substantially same as a display apparatus of FIGS. 1 and 2 except for a mold frame 600. Thus, any further detailed descriptions concerning the same elements will be briefly described or omitted.

The display apparatus includes a receiving container including a bottom chassis 100 and a top chassis 500, a backlight assembly 200, an optical element 300, a mold frame 600, a display panel 400, a driving substrate 450 and a connecting part 460.

The bottom chassis 100 includes a bottom plate 102, a first side wall 110, a second side wall 120, a third side wall 130 and a fourth side wall 140.

The backlight assembly 200 includes a light driving substrate 210, a plurality of LED bars 220 and a reflecting element 230. The reflecting element 230 includes a reflecting bottom surface 231, a first reflecting side surface 232, a second reflecting side surface 234, a third reflecting side surface 236 and a fourth reflecting side surface 238. A plurality of through holes 233 through which the LED bars 220 are extended is defined through the first reflecting side surface 232. The LED bar 220 includes a plurality of LED light sources 222 which generates the light.

The display panel 400 includes a lower substrate 410, an upper substrate 420 and a liquid crystal layer (nor shown) between the lower substrate 410 and the upper substrate 420.

The connecting part 460 includes a flexible printed circuit film 462 and an IC chip 464.

The top chassis 500 includes a first side surface 510, a second side surface 520, a third side surface 530 and a fourth side surface 540. An opening 502 exposing the display panel 400 is defined through the top chassis 500. The first side surface 510 includes a first inclined surface 512 and a first surface 514. The second side surface 520 includes a second inclined surface 522 and a second surface 524.

The mold frame 600 includes a first mold side wall 610, a second mold side wall 620, a third mold side wall 630, a fourth mold side wall 640 and a panel supporting portion 650.

The first mold side wall 610 includes a first mold inclined surface 612 and a first mold surface 614. The first mold surface 614 extends in a third direction D3. The first mold inclined surface 612 extends from the first mold surface 614, and is inclined with respect to the third direction D3. Thus, an angle between the first mold inclined surface 612 and the display panel 400 may be greater than about 90 degrees and less than about 180 degrees. The first mold inclined surface 612 is in parallel with the first side wall 110 of the bottom chassis 100 and the first side surface 510 of the top chassis 500. Thus, the first mold side wall 610 may be disposed on the first side wall 110, and the driving substrate 450 may be disposed between the first mold side wall 610 and the first inclined surface 512 of the top chassis 500.

A protrusion 616 configured to support the driving substrate 450 is disposed on the first mold side wall 610. The protrusion 616 is disposed on a first mold inclined surface 612 of the first mold side wall 610, so that the driving substrate 450 may be effectively prevented from leaving away from the display panel.

A connecting groove 615 may be defined in the first mold side wall 610. The connecting groove 615 may be defined through the first mold surface 614, and the connecting part 460 may be received in the connecting groove 615.

The second mold side wall 620 is spaced apart from the first mold side wall 610 in the first direction D1 and faces the first mold side wall 610. The second mold side wall 620 includes a second mold inclined surface 622 and a second mold surface 624. The second mold inclined surface 622 extends from the second mold surface 624 and inclined by a predetermined angle with respect to the third direction D3. Thus, an angle between the second mold inclined surface 622 and the display panel 400 may be less than about 90 degrees. The second mold inclined surface 622 is in parallel with the second side wall 120 of the bottom chassis 100 and the second side surface 520 of the top chassis 500. Thus, the second mold side wall 620 is disposed between the second side wall 120 of the bottom chassis 100 and the second side surface 520 of the top chassis 500.

The third mold side wall 630 extends in a first direction D1, and connects the first mold side wall 610 to the second mold side wall 620. The third mold side wall 630 extends in the third direction D3. The fourth mold side wall 640 extends in a first direction D1, and connects the first mold side wall 610 to the second mold side wall 620. The fourth mold side wall 640 extends in the third direction D3, and faces the third mold side wall 630 in the second direction D2.

The panel supporting portion 650 is provided in a space defined by the first to fourth mold side walls 610, 620, 630 and 640, and supports the display panel 400. An opening 602 is defined through the panel supporting portion 650 to pass light generated from the backlight assembly 200 to the display panel 400.

Figure 5:
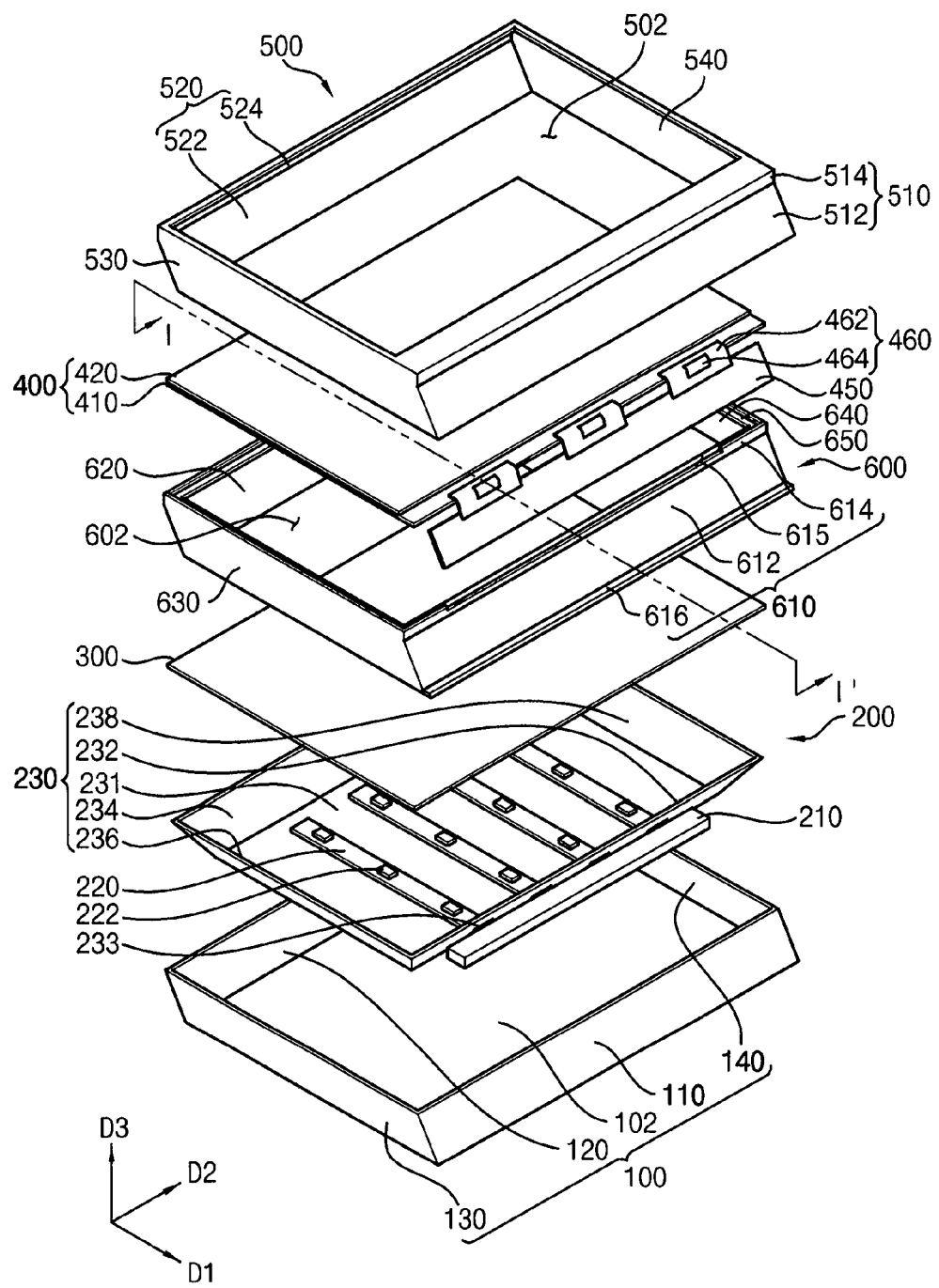
FIG. 5 is an exploded perspective view illustrating still another exemplary embodiment of a display apparatus according to the invention.
Figure 6:
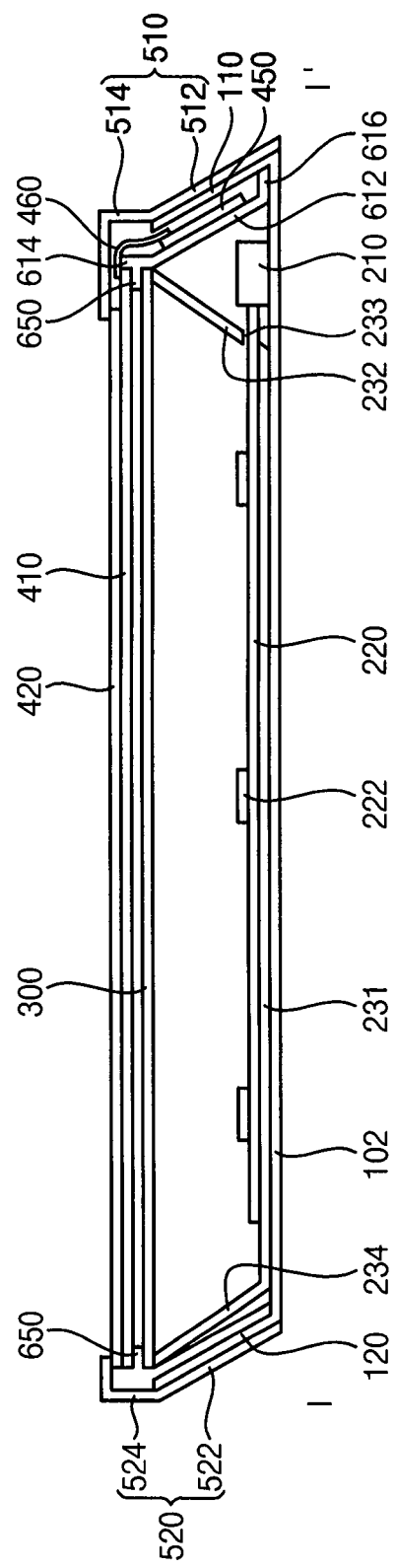
FIG. 6 is a cross-sectional view taken along line I-I' of FIG. 5.

FIG. 5 is an exploded perspective view illustrating a display apparatus according to still another exemplary embodiment of the invention. FIG. 6 is a cross-sectional view taken along line I-I' of FIG. 5.

Referring to FIGS. 5 and 6, a display apparatus is substantially same as a display apparatus of FIGS. 3 and 4 except for a mold frame 600. Thus, any further detailed descriptions concerning the same elements will be briefly described or omitted.

The display apparatus includes a receiving container including a bottom chassis 100 and a top chassis 500, a backlight assembly 200, an optical element 300, a mold frame 600, a display panel 400, a driving substrate 450 and a connecting part 460.

The bottom chassis 100 includes a bottom plate 102, a first side wall 110, a second side wall 120, a third side wall 130 and a fourth side wall 140.

The backlight assembly 200 includes a light driving substrate 210, a plurality of LED bars 220 and a reflecting element 230. The reflecting element 230 includes a reflecting bottom surface 231, a first reflecting side surface 232, a second reflecting side surface 234, a third reflecting side surface 236 and a fourth reflecting side surface 238. A plurality of through holes 233 through which the LED bars 220 are extended is defined through the first reflecting side surface 232. The LED bar 220 includes a plurality of LED light sources 222 which generates the light.

The display panel 400 includes a lower substrate 410, an upper substrate 420 and a liquid crystal layer (nor shown) between the lower substrate 410 and the upper substrate 420.

The connecting part 460 includes a flexible printed circuit film 462 and an IC chip 464.

The top chassis 500 includes a first side surface 510, a second side surface 520, a third side surface 530 and a fourth side surface 540. An opening 502 exposing the display panel 400 is defined through the top chassis 500. The first side surface 510 includes a first inclined surface 512 and a first surface 514. The second side surface 520 includes a second inclined surface 522 and a second surface 524.

The mold frame 600 is received in the bottom chassis 100. The mold frame 600 includes a first mold side wall 610, a second mold side wall 620, a third mold side wall 630, a fourth mold side wall 640 and a panel supporting portion 650.

The first mold side wall 610 includes a first mold inclined surface 612 and a first mold surface 614. The first mold surface 614 extends in a third direction D3. The first mold inclined surface 612 extends from the first mold surface 614, and is inclined with respect to the third direction D3. Thus, an angle between the first mold inclined surface 612 and the display panel 400 may be greater than about 90 degrees and less than about 180 degrees. The first mold inclined surface 612 is in parallel with the first side wall 110 of the bottom chassis 100 and the first side surface 510 of the top chassis 500. Thus, the first mold side wall 610 may be disposed inside the first side wall 110 of the bottom chassis 100, and the driving substrate 450 may be disposed between the first mold side wall 610 and the first side wall 110 of the bottom chassis 100. Thus, the first side wall 110 of the bottom chassis 100 is disposed between the first mold side wall 610 and the first side surface 510 of the top chassis 500.

A protrusion 616 configured to support the driving substrate 450 is provided on the first mold side wall 610. The protrusion 616 is provided on a first mold inclined surface 612 of the first mold side wall 610 to define a space for the driving substrate 450 between the first mold inclined surface 612 and the first side wall 110 of the bottom chassis 100.

A connecting groove 615 is defined in the first mold side wall 610. The connecting groove 615 is defined through the first mold surface 614, so that the connecting part 460 may be received in the connecting groove 615.

The second mold side wall 620 is spaced apart from the first mold side wall 610 in the first direction D1 and faces the first mold side wall 610. The second mold side wall 620 includes a second mold inclined surface 622 and a second mold surface 624. The second mold inclined surface 622 extends from the second mold surface 624 and inclined by a predetermined angle with respect to the third direction D3. Thus, an angle between the second mold inclined surface 622 and the display panel 400 may be less than about 90 degrees. The second mold inclined surface 622 is in parallel with the second side wall 120 of the bottom chassis 100 and the second side surface 520 of the top chassis 500. Thus, the second mold side wall 620 is disposed inside of the second side wall 120 of the bottom chassis 100, so that the second side surface 520 is disposed between the second mold side wall 620 an the second side wall 120 of the bottom chassis 100.

The third mold side wall 630 extends in a first direction D1, and connects the first mold side wall 610 to the second mold side wall 620. The third mold side wall 630 extends in the third direction D3. The fourth mold side wall 640 extends in a first direction D1, and connects the first mold side wall 610 to the second mold side wall 620. The fourth mold side wall 640 extends in the third direction D3, and faces the third mold side wall 630 in the second direction D2.

The panel supporting portion 650 is provided in a space defined by the first to fourth mold side walls 610, 620, 630 and 640, and supports the display panel 400. An opening 602 is defined through the panel supporting portion 650 to pass light generated from the backlight assembly 200 to the display panel 400.

Figure 7:
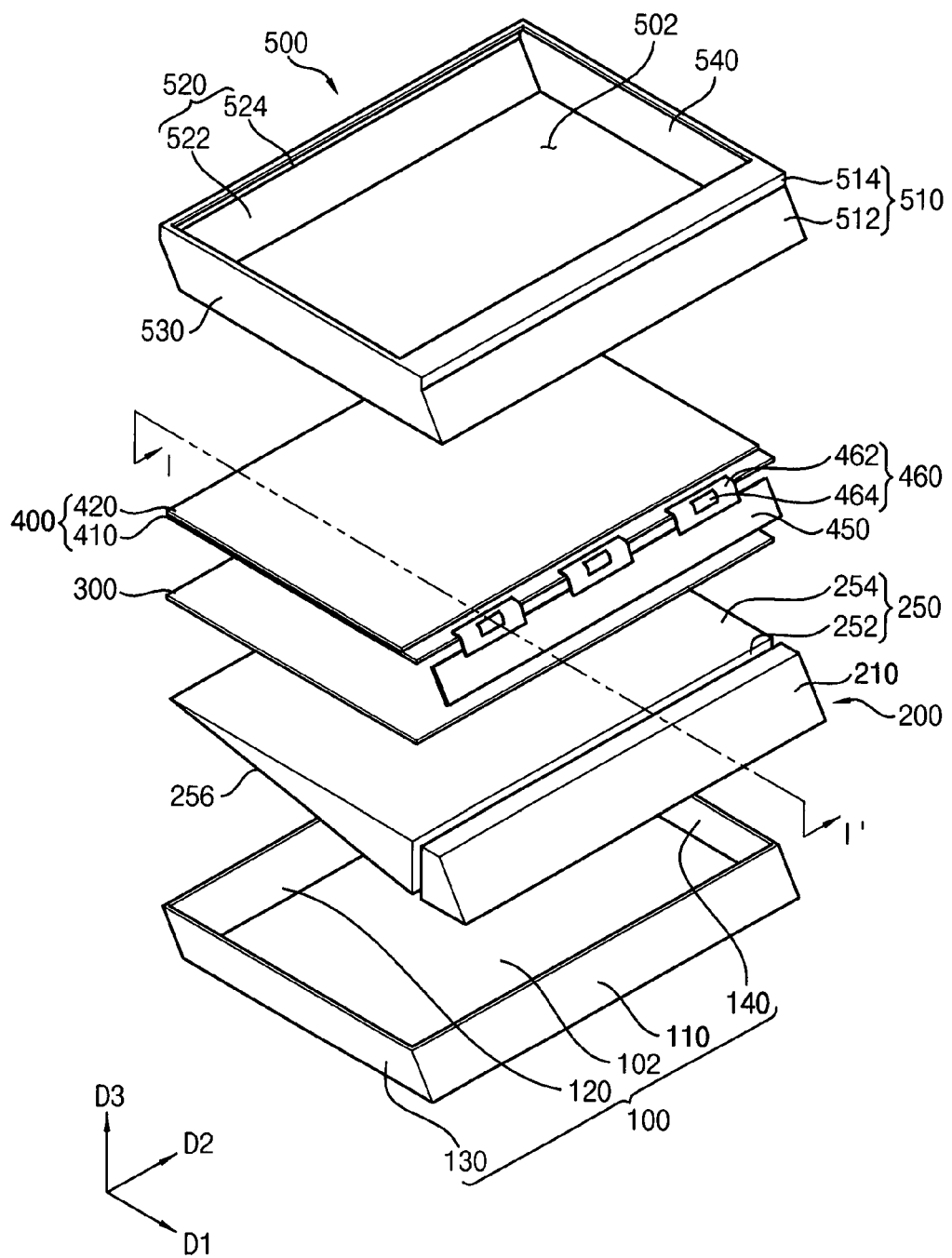
FIG. 7 is an exploded perspective view illustrating still another exemplary embodiment of a display apparatus according to the invention.
Figure 8:
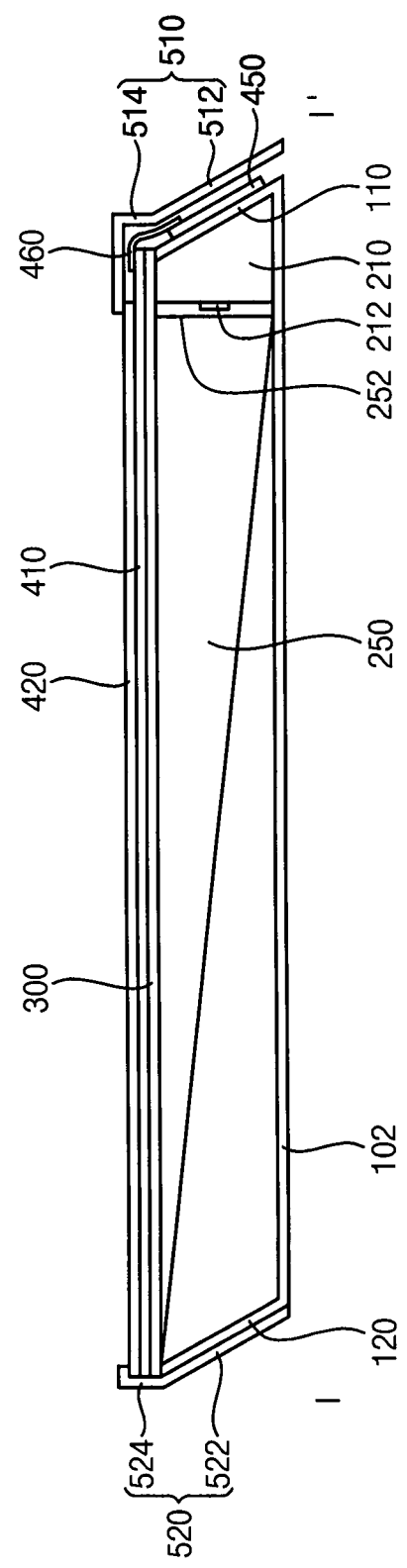
FIG. 8 is a cross-sectional view taken along line I-I' of FIG. 7.

FIG. 7 is an exploded perspective view illustrating a display apparatus according to still another exemplary embodiment of the invention. FIG. 8 is a cross-sectional view taken along line I-I' of FIG. 7.

Referring to FIGS. 7 and 8, a display apparatus is substantially same as a display apparatus of FIGS. 1 and 2 except for a backlight assembly 200. Thus, any further detailed descriptions concerning the same elements will be briefly described or omitted.

The display apparatus includes a receiving container including a bottom chassis 100 and a top chassis 500, a backlight assembly 200, an optical element 300, a display panel 400, a driving substrate 450 and a connecting part 460.

The bottom chassis 100 includes a bottom plate 102, a first side wall 110, a second side wall 120, a third side wall 130 and a fourth side wall 140.

The display panel 400 includes a lower substrate 410, an upper substrate 420 and a liquid crystal layer (nor shown) between the lower substrate 410 and the upper substrate 420.

The connecting part 460 includes a flexible printed circuit film 462 and an IC chip 464.

The top chassis 500 includes a first side surface 510, a second side surface 520, a third side surface 530 and a fourth side surface 540. An opening 502 exposing the display panel 400 is defined through the top chassis 500. The first side surface 510 includes a first inclined surface 512 and a first surface 514. The second side surface 520 includes a second inclined surface 522 and a second surface 524.

The backlight assembly 200 may be received in the bottom chassis 100, and disposed under the display panel 400. The backlight assembly 200 supplies light to the display panel 400.

The backlight assembly 200 includes a light source part 210 and a light guiding plate 250. The light source part 210 includes a light source 212. The light guiding plate 250 includes an incident surface 252, an exit surface 254 and a reflecting surface 256.

The light source part 210 extends in a second direction D2. The light source part 210 may be disposed in a space defined by the first side wall 110 and the bottom plate 102 of the bottom chassis 100. The light source part 210 includes the light source 212 which generates the light.

The incident surface 252 of the light guiding plate 250 faces the light source 212. The exit surface 254 is adjacent to the incident surface 252, and disposed in parallel with the display panel 400. The reflecting surface 256 faces the exiting surface 254, and reflects the light which enters into the incident surface 252 toward the exiting surface 254.

Figure 9:
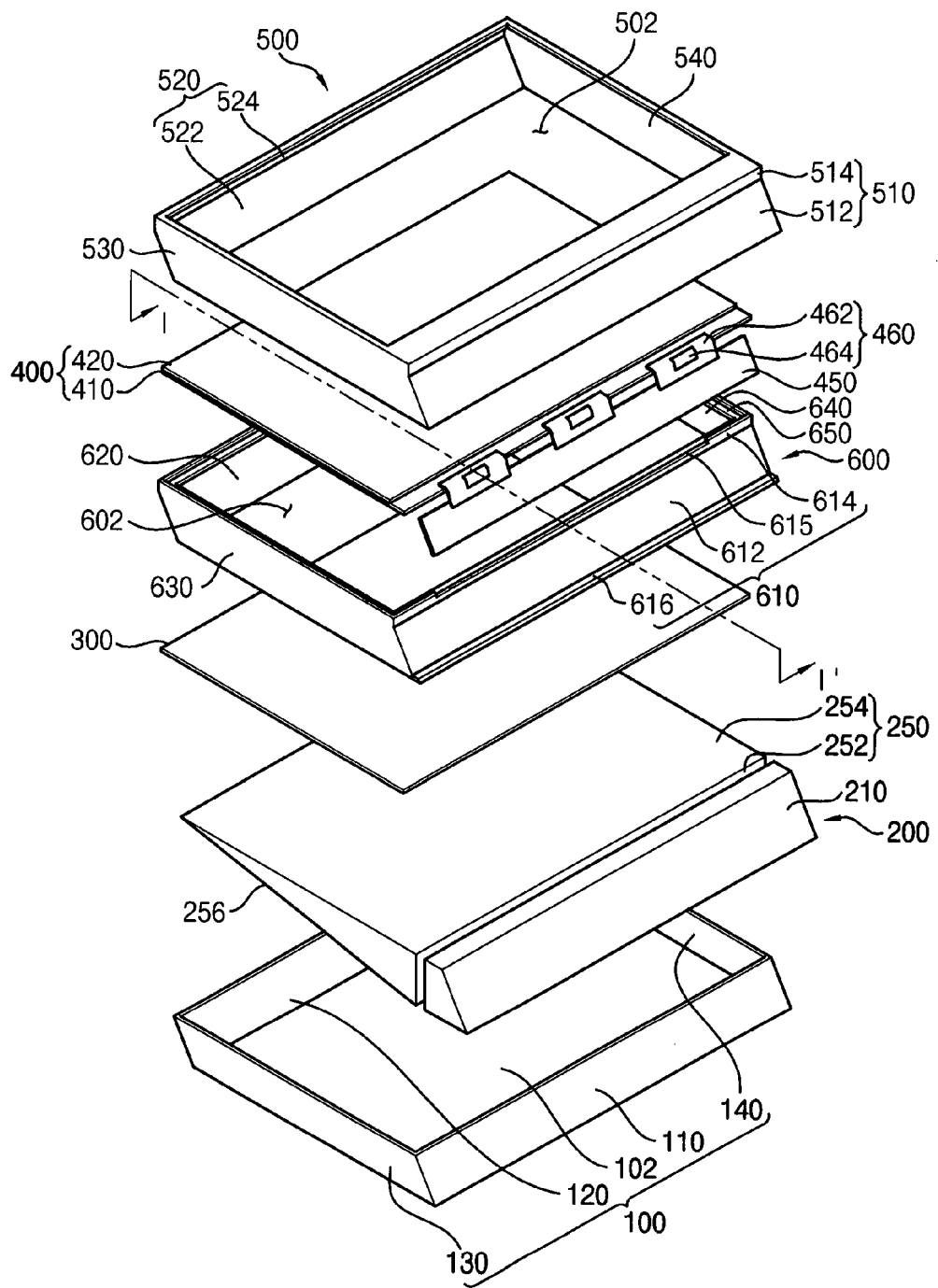
FIG. 9 is an exploded perspective view illustrating still another exemplary embodiment of a display apparatus according to the invention.
Figure 10:
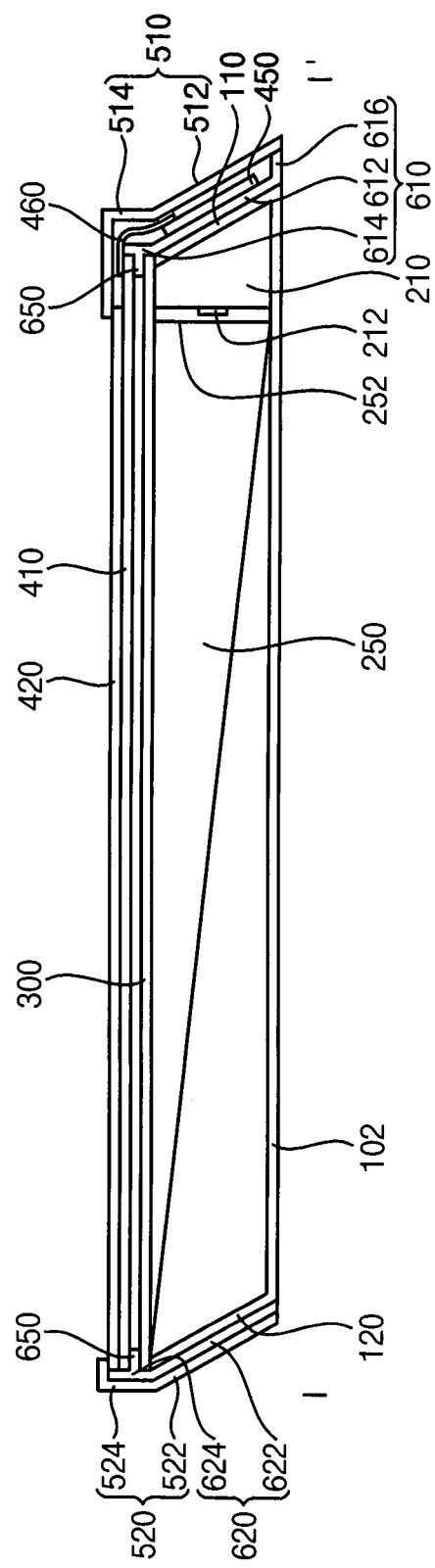
FIG. 10 is a cross-sectional view taken along line I-I' of FIG. 9.

FIG. 9 is an exploded perspective view illustrating a display apparatus according to still another exemplary embodiment of the invention. FIG. 10 is a cross-sectional view taken along line I-I' of FIG. 9.

Referring to FIGS. 9 and 10, a display apparatus is substantially same as a display apparatus of FIGS. 7 and 8 except for a mold frame 600. Thus, any further detailed descriptions concerning the same elements will be briefly described or omitted.

The display apparatus includes a receiving container including a bottom chassis 100 and a top chassis 500, a backlight assembly 200, an optical element 300, a mold frame 600, a display panel 400, a driving substrate 450 and a connecting part 460.

The bottom chassis 100 includes a bottom plate 102, a first side wall 110, a second side wall 120, a third side wall 130 and a fourth side wall 140.

The display panel 400 includes a lower substrate 410, an upper substrate 420 and a liquid crystal layer (nor shown) between the lower substrate 410 and the upper substrate 420.

The connecting part 460 includes a flexible printed circuit film 462 and an IC chip 464.

The top chassis 500 includes a first side surface 510, a second side surface 520, a third side surface 530 and a fourth side surface 540. An opening 502 exposing the display panel 400 is defined through the top chassis 500. The first side surface 510 includes a first inclined surface 512 and a first surface 514. The second side surface 520 includes a second inclined surface 522 and a second surface 524.

The backlight assembly 200 may be received in the bottom chassis 100, and disposed under the display panel 400. The backlight assembly 200 supplies light to the display panel 400.

The backlight assembly 200 includes a light source part 210 and a light guiding plate 250. The light source part 210 includes a light source 212. The light guiding plate 250 includes an incident surface 252, an exit surface 254 and a reflecting surface 256.

The mold frame 600 includes a first mold side wall 610, a second mold side wall 620, a third mold side wall 630, a fourth mold side wall 640 and a panel supporting portion 650. The first mold side wall 610 includes a first mold inclined surface 612 and a first mold surface 614. A protrusion 616 configured to support the driving substrate 450 is disposed on the first mold side wall 610. A connecting groove 615 may be defined in the first mold side wall 610. The second mold side wall 620 includes a second mold inclined surface 622 and a second mold surface 624. The mold frame 600 is substantially same as a mold frame 600 of FIGS. 3 and 4. Thus, any further any further detailed descriptions concerning the same elements will be omitted.

Figure 11:
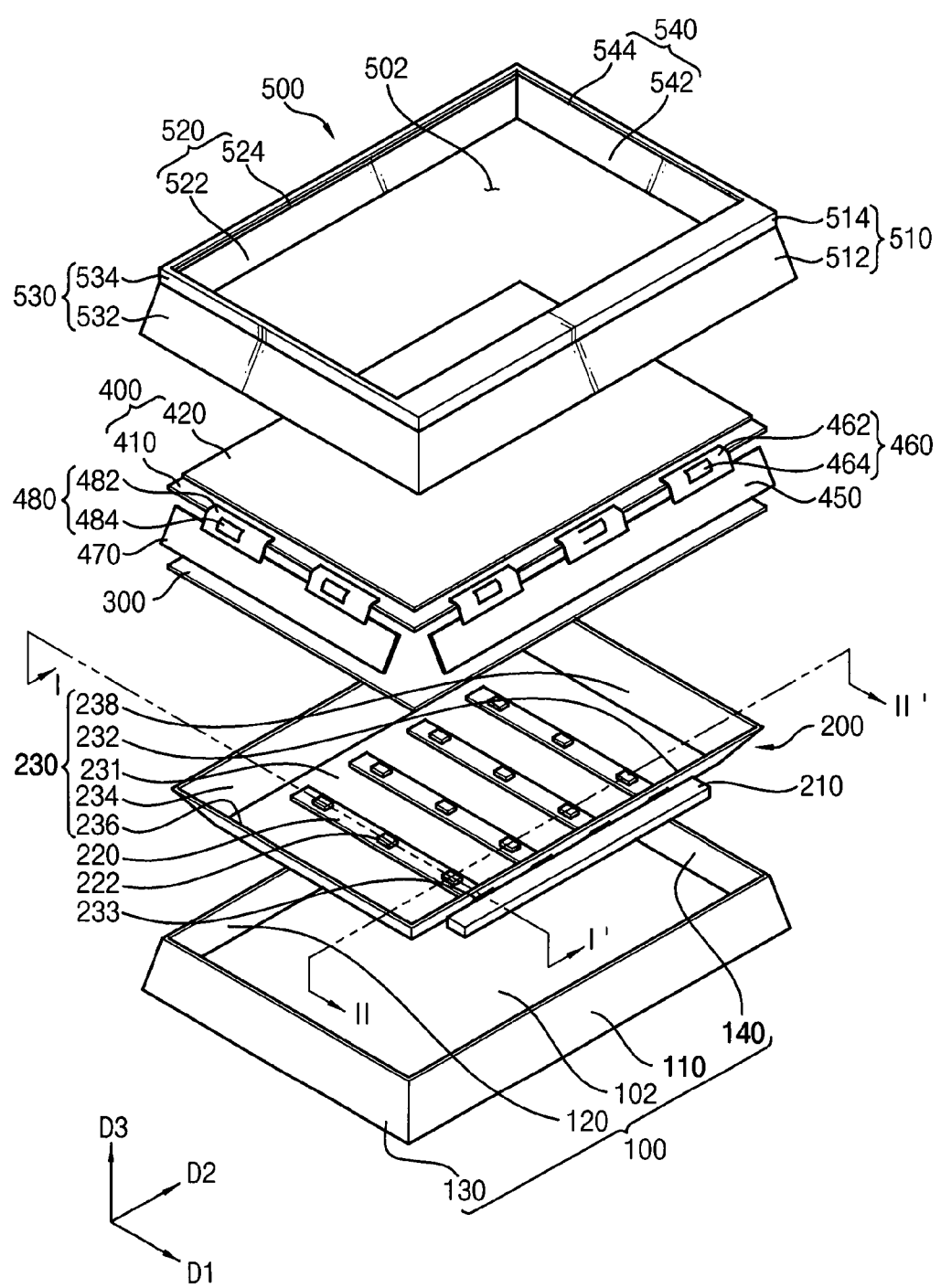
FIG. 11 is an exploded perspective view illustrating still another exemplary embodiment of a display apparatus according to the invention.
Figure 12:
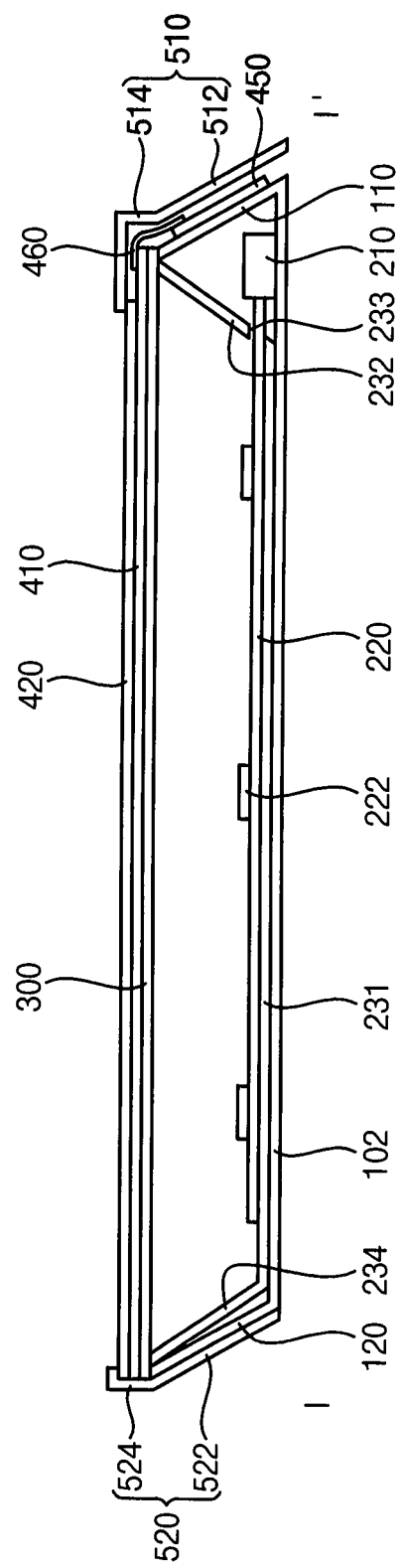
FIG. 12 is a cross-sectional view taken along line I-I' of FIG. 11.
Figure 13:
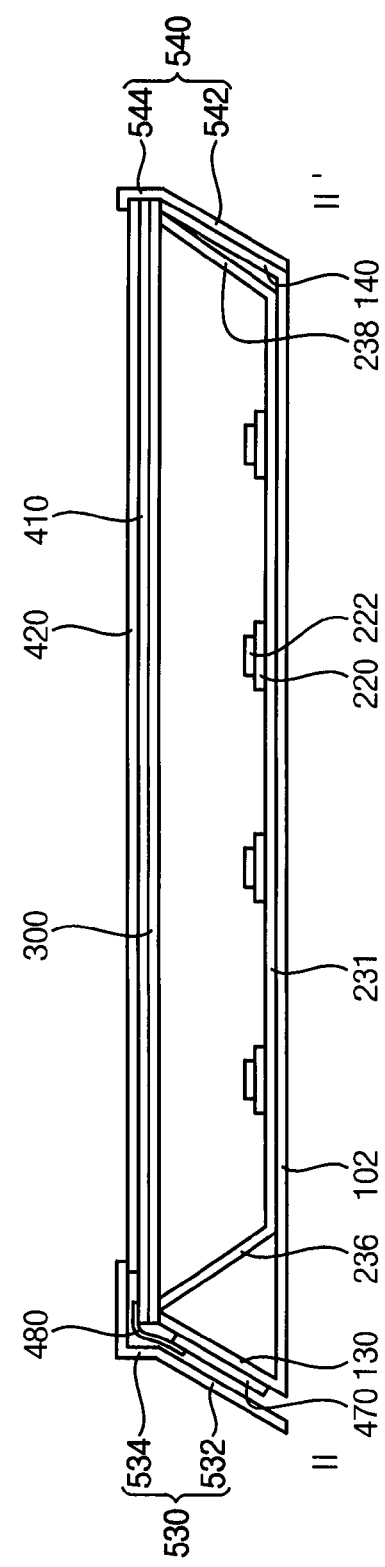
FIG. 13 is a cross-sectional view taken along line II-II' of FIG. 11.

FIG. 11 is an exploded perspective view illustrating a display apparatus according to still another exemplary embodiment of the invention. FIG. 12 is a cross-sectional view taken along line I-I' of FIG. 11. FIG. 13 is a cross-sectional view taken along line II-II' of FIG. 11.

Referring to FIGS. 11 and 13, a display apparatus is substantially same as a display apparatus of FIGS. 1 and 2 except for a first driving substrate 450, a first connecting part 460, a second driving substrate 470, a second connecting part 480, a bottom chassis 100 and a top chassis 500. Thus, any further any further detailed descriptions concerning the same elements will be briefly described or omitted.

The display apparatus includes a receiving container including a bottom chassis 100 and a top chassis 500, a backlight assembly 200, an optical element 300, a display panel 400, a first driving substrate 450, a first connecting part 460, a second driving substrate 470 and a second connecting part 480.

The bottom chassis 100 includes a bottom plate 102, a first side wall 110, a second side wall 120, a third side wall 130 and a fourth side wall 140. The first side wall 110 extends from the bottom plate 102. The second side wall 110 extends from the bottom plate 102, and faces the first side wall 110 in a first direction D1. The third side wall 103 extends from the bottom plate 102 and is connected to the first side wall 110 and the second side wall 120. The fourth side wall 140 extends from the bottom plate 102, is connected to the first side wall 110 and the second side wall 120, and faces the third side wall 130 in a second direction D2 which is substantially perpendicular to the first direction D1.

The first side wall 110 is inclined by a predetermined angle with respect to a third direction D3. The third direction D3 is substantially perpendicular to the first and second directions D1 and D2. Thus, an angle between the first side wall 110 and the bottom plate 102 is less than about 90 degrees.

The second side wall 120 is inclined by a predetermined angle with respect to the third direction D3. Thus, an angle between the second side wall 120 and the bottom plate 102 is about greater than 90 degrees and less than 180 degrees. The second side wall 120 may be in parallel with the first side wall 110.

The third side wall 130 is inclined by a predetermined angle with respect to the third direction D3. Thus, an angle between the third side wall 130 and the bottom plate 102 is less than about 90 degrees.

The fourth side wall 140 is inclined by a predetermined angle with respect to the third direction D3. Thus, an angle between the fourth side wall 140 and the bottom plate 102 is greater than about 90 degrees and less than about 180 degrees. The fourth side wall 140 may be in parallel with the third side wall 130.

The backlight assembly 200 includes a light driving substrate 210, a plurality of LED bars 220 and the reflecting element 230.

The reflecting element 230 includes a reflecting bottom surface 231, a first reflecting side surface 232, a second reflecting side surface 234, a third reflecting side surface 236 and a fourth reflecting side surface 238. A plurality of through holes 233 through which the LED bars 220 are extended is defined through the first reflecting side surface 232. The LED bar 220 includes a plurality of LED light sources 222 which generates the light.

The optical element 300 is dispose between the display panel 400 and the backlight assembly 200.

The display panel 400 is disposed on the optical element 300. The display panel 400 includes a lower substrate 410, an upper substrate 420 and a liquid crystal layer (nor shown) between the lower substrate 410 and the upper substrate 420.

The first driving substrate 450 is disposed adjacent to the display panel 400 in the first direction D1. The first driving substrate 450 extends in the second direction D2. A driving circuit configured to drive the display panel 400 is disposed on the first driving substrate 450. The first driving substrate 450 is electrically connected to the display panel 400 through the first connecting part 460.

The first driving substrate 450 is inclined by a predetermined angle with respect to a plane on which the display panel 400 is disposed. Thus, an angle between the first driving substrate 450 and the display panel 400 may be greater than about 90 degrees and less than about 180 degrees. The first driving substrate 450 may be disposed on the first side wall 110 of the bottom chassis 100 in parallel with the first side wall 110. The first driving substrate 450 may be fixed on the first side wall 110 of the bottom chassis 100 by an adhesive such as an adhesive tape, for example. In addition, the first driving substrate 450 may be spaced apart from the first side wall 110 without being fixed on the first side wall 110 of the bottom chassis 100. The first driving substrate 450 may be spaced apart from the display panel 400 and not overlap the display panel 400.

The first connecting part 460 connects the first driving substrate 450 to the display panel 400. The first connecting part 460 includes a flexible printed circuit film 462 and an IC chip 464. The flexible printed circuit film 462 electrically connects the first driving substrate 450 to electrode pads provided at an exposed portion of the display panel 400. In an exemplary embodiment, the IC chip 464 may be directly mounted on the flexible printed circuit film 462. However, the invention is not limited thereto, and the IC chip 464 may not be directly mounted on the flexible printed circuit film 462.

The second driving substrate 470 is disposed adjacent to the display panel 400 in the second direction D2. The second driving substrate 470 extends in the first direction D1. A driving circuit configured to drive the display panel 400 is disposed on the second driving substrate 470. The second driving substrate 470 is electrically connected to the display panel 400 through the second connecting part 480.

The second driving substrate 470 is inclined by a predetermined angle with respect to a plane on which the display panel 400 is disposed. Thus, an angle between the second driving substrate 470 and the display panel 400 may be greater than about 90 degrees and less than about 180 degrees. The second driving substrate 470 may be disposed on the third side wall 130 of the bottom chassis 100 in parallel with the third side wall 130. In an exemplary embodiment, the second driving substrate 470 may be fixed on the third side wall 130 of the bottom chassis 100 by an adhesive such as an adhesive tape, for example. In another exemplary embodiment, the second driving substrate 470 may be spaced apart from the third side wall 130 without being fixed on the third side wall 130 of the bottom chassis 100. In another exemplary embodiment, the second driving substrate 470 may be spaced apart from the display panel 400 and not overlap the display panel 400.

The second connecting part 480 connects the second driving substrate 470 to the display panel 400. The second connecting part 480 includes a flexible printed circuit film 482 and an IC chip 484. The flexible printed circuit film 482 electrically connects the second driving substrate 470 to electrode pads provided at an exposed portion of the display panel 400. In an exemplary embodiment, the IC chip 484 may be directly mounted on the flexible printed circuit film 482. However, the invention is not limited thereto, and the IC chip 484 may not be directly mounted on the flexible printed circuit film 482.

In an exemplary embodiment, the first driving substrate 450 may be a data driving substrate to generate a data signal, and the second driving substrate 470 may be a gate driving substrate to generate a gate signal, for example.

The top chassis 500 includes a first side surface 510, a second side surface 520, a third side surface 530 and a fourth side surface 540. An opening 502 exposing the display panel 400 is defined through the top chassis 500.

The first side surface 510 includes a first inclined surface 512 and a first surface 514. The first surface 514 extends in third direction D3. The first surface 514 corresponds to a boundary of the display panel 400. The first inclined surface 512 extends from the first surface 514, and inclined with respect to the third direction D3. Thus, an angle between the display panel 400 and the first inclined surface 512 may be greater than about 90 degrees and less than about 180 degrees. The first inclined surface 512 disposed in parallel with the first side wall 110 of the bottom chassis 100. Thus, the first driving substrate 450 may be disposed between the first inclined surface 512 and the first side wall 110.

The second side surface 520 is spaced apart from the first side surface 510 in the first direction D1 to face the first side surface 510. The second side surface 520 includes a second inclined surface 522 and a second surface 524. The second surface 524 extends in the third direction D3. The second surface 524 corresponds to a boundary of the display panel 400. The second inclined surface 522 extends from the second surface 524, and inclined by a predetermined angle with respect to the third direction D3. Thus, an angle between the second inclined surface 522 and the display panel 400 may less than about 90 degrees. The second inclined surface 522 is in parallel with the second side wall 120 of the bottom chassis 100.

The third side surface 530 includes a third inclined surface 532 and a third surface 534. The third surface 534 extends in third direction D3. The third surface 534 corresponds to a boundary of the display panel 400. The third inclined surface 532 extends from the third surface 534, and inclined with respect to the third direction D3. Thus, an angle between the display panel 400 and the third inclined surface 532 may be greater than about 90 degrees and less than about 180 degrees. The third inclined surface 532 disposed in parallel with the third side wall 130 of the bottom chassis 100. Thus, the second driving substrate 470 may be disposed between the third inclined surface 532 and the third side wall 130.

The fourth side surface 540 is spaced apart from the third side surface 530 in the second direction D2 to face the first side surface 510. The fourth side surface 540 includes a fourth inclined surface 542 and a fourth surface 544. The fourth surface 544 extends in the third direction D3. The fourth surface 544 corresponds to a boundary of the display panel 400. The fourth inclined surface 542 extends from the fourth surface 544, and inclined by a predetermined angle with respect to the third direction D3. Thus, an angle between the fourth inclined surface 542 and the display panel 400 may less than about 90 degrees. The fourth inclined surface 542 is in parallel with the fourth side wall 140 of the bottom chassis 100.

For a multi-screen display (refers to FIG. 17) which includes a plurality of display apparatuses continuously disposed, a space of the display apparatus in which the first and second driving substrates 450 and 470 are received overlaps a display panel of an adjacent display apparatus. Thus, a bezel width between the display apparatuses may be decreased.

Figure 14:
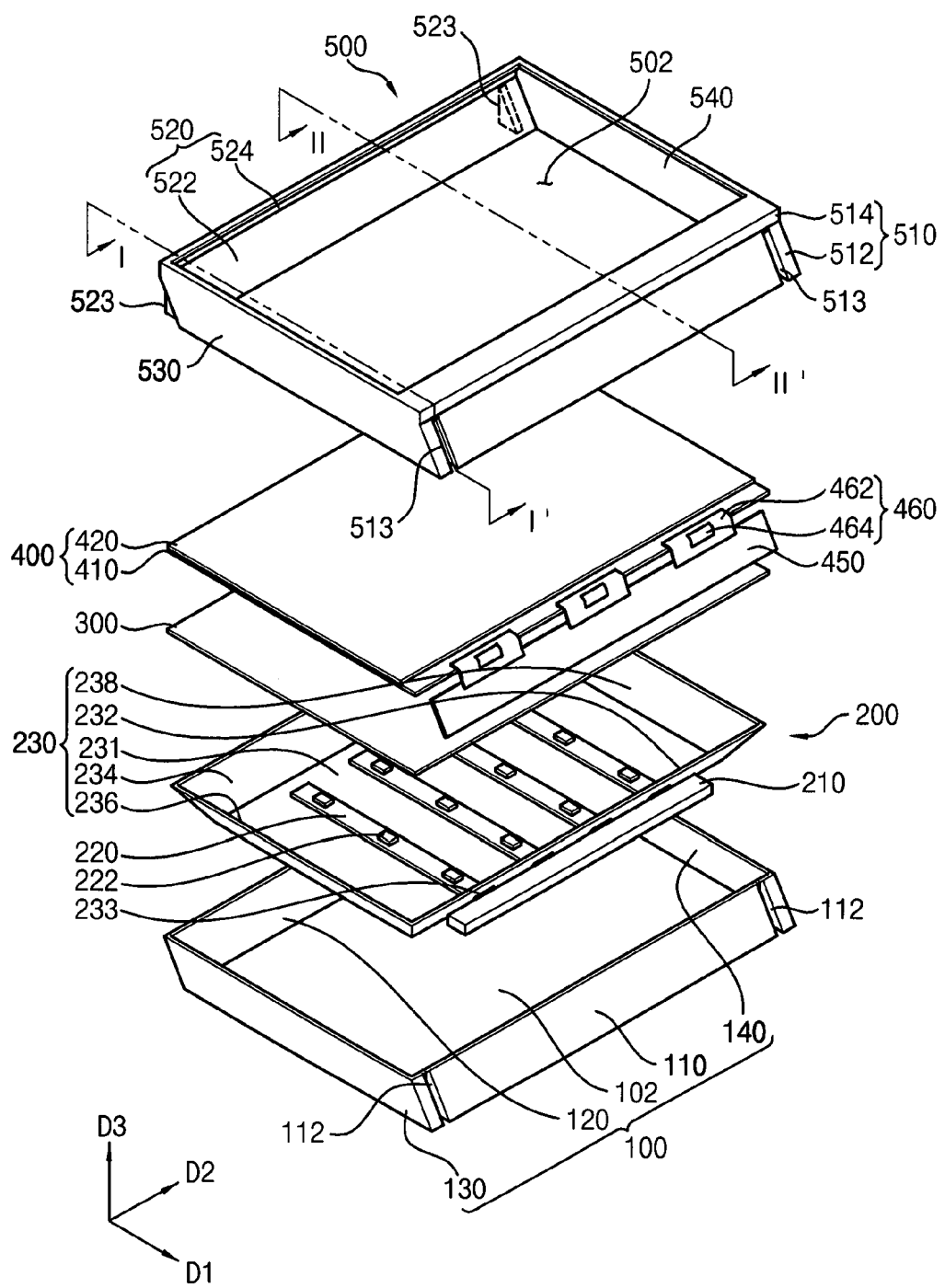
FIG. 14 is an exploded perspective view illustrating still another exemplary embodiment of a display apparatus according to the invention.
Figure 15:
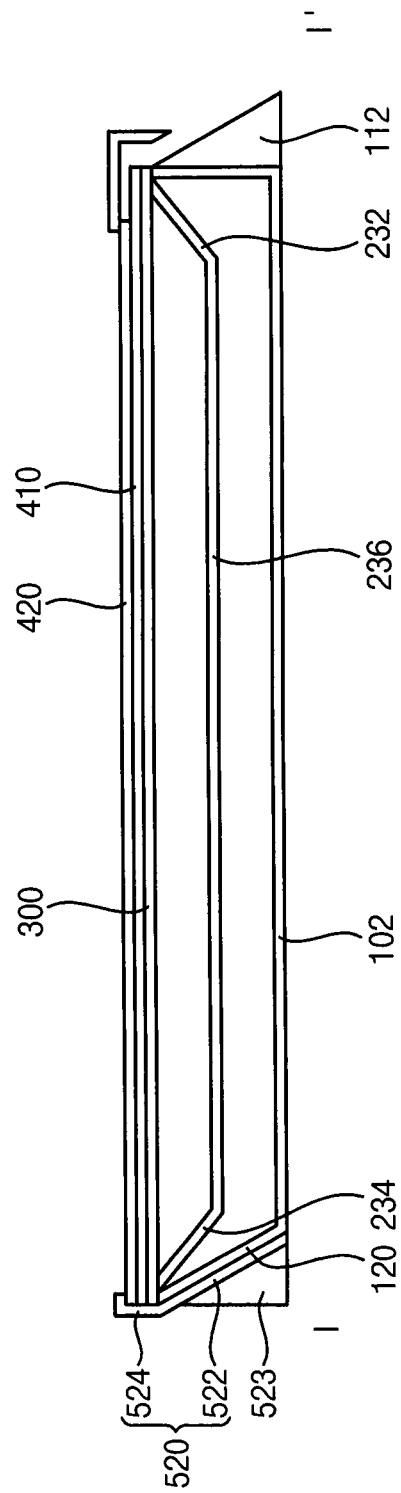
FIG. 15 is a cross-sectional view taken along line I-I' of FIG. 14.
Figure 16:
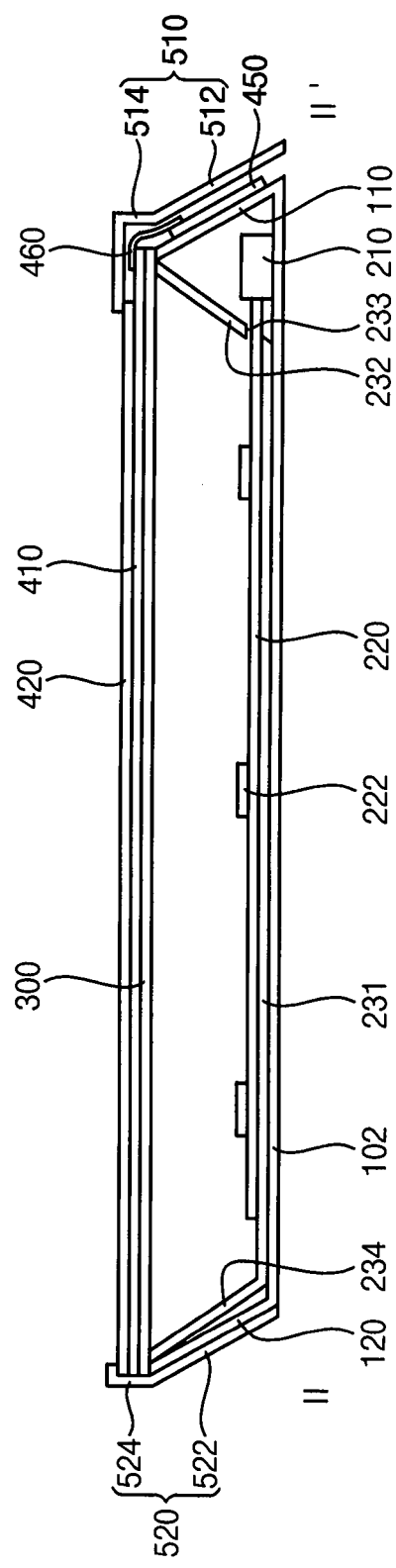
FIG. 16 is a cross-sectional view taken along line II-II' of FIG. 14.

FIG. 14 is an exploded perspective view illustrating a display apparatus according to still another exemplary embodiment of the invention. FIG. 15 is a cross-sectional view taken along line I-I' of FIG. 14. FIG. 16 is a cross-sectional view taken along line II-II' of FIG. 14.

Referring to FIGS. 14 to 16, a display apparatus is substantially same as a display apparatus of FIGS. 1 and 2 except for a supporting portion 523 of a top chassis 500 and a supporting portion groove 112 of a bottom chassis 100. Thus, any further detailed descriptions concerning the same elements will be briefly described or omitted The display apparatus includes a receiving container including a bottom chassis 100 and a top chassis 500, a backlight assembly 200, an optical element 300, a display panel 400, a driving substrate 450 and a connecting part 460, The bottom chassis 100 includes a bottom plate 102, a first side wall 110, a second side wall 120, a third side wall 130 and a fourth side wall 140.

A supporting portion groove 112 is defined in the first side wall 110. A supporting portion 523 of a top chassis 500 of an adjacent display apparatus may be received in the supporting portion groove 112. Thus, for a multi-screen display (refers to FIG. 17) which includes a plurality of display apparatuses continuously disposed, although the supporting portion 523 of the top chassis 500 is protruded, the supporting portion 523 may be received in the supporting portion groove 112 of the bottom chassis 100, so that an area which an image is not displayed may be decreased.

The backlight assembly 200 includes a light driving substrate 210, a plurality of LED bars 220 and a reflecting element 230. The reflecting element 230 includes a reflecting bottom surface 231, a first reflecting side surface 232, a second reflecting side surface 234, a third reflecting side surface 236 and a fourth reflecting side surface 238. A plurality of through holes 233 through which the LED bars 220 are extended is defined through the first reflecting side surface 232. The LED bar 220 includes a plurality of LED light sources 222 which generates the light.

The display panel 400 is disposed on the optical element 300. The display panel 400 includes a lower substrate 410, an upper substrate 420 and a liquid crystal layer (nor shown) between the lower substrate 410 and the upper substrate 420.

The connecting part 460 includes a flexible printed circuit film 462 and an IC chip 464.

The top chassis 500 includes a first side surface 510, a second side surface 520, a third side surface 530 and a fourth side surface 540. An opening 502 exposing the display panel 400 is defined through the top chassis 500. The first side surface 510 includes a first inclined surface 512 and a first surface 514. The second side surface 520 includes a second inclined surface 522 and a second surface 524.

A supporting portion 523 is protruded from the second inclined surface 522 of the top chassis 500. The supporting portion 523 may support the second side surface 520 of the top chassis 500 which is inclined with respect to a third direction D3 and support the second side wall 120.

A supporting portion groove 513 is defined in the first inclined surface 512 of the top chassis 500. A supporting portion 523 of a top chassis 500 of an adjacent display apparatus may be received in the supporting portion groove 513. Thus, for a multi-screen display (refers to FIG. 17) which includes a plurality of display apparatuses continuously disposed, although the supporting portion 523 of the top chassis 500 is protruded, the supporting portion 523 may be received in the supporting portion groove 513 of the top chassis 500 and the supporting portion groove 112 of the bottom chassis 100, so that an area which an image is not displayed may be decreased.

Figure 17:
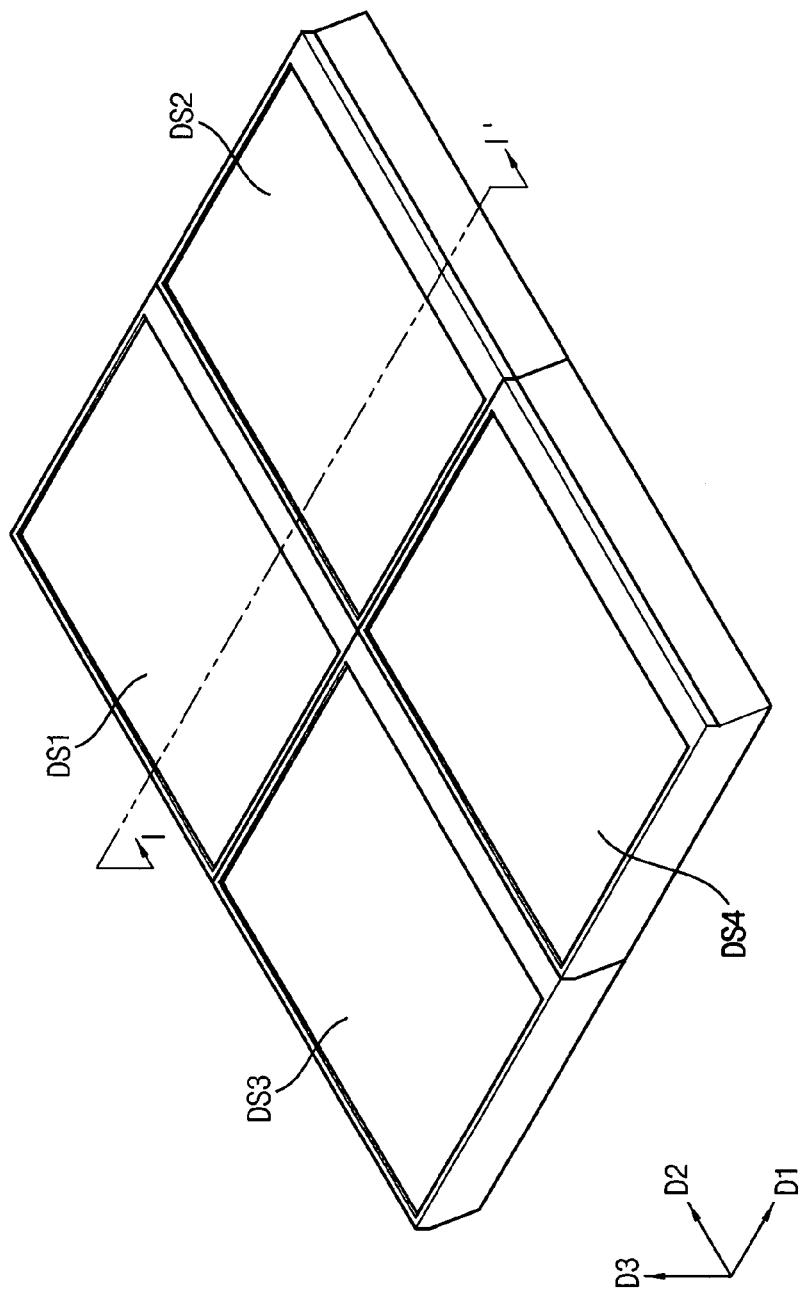
FIG. 17 is a perspective view of an exemplary embodiment of a display apparatus according to the invention.
Figure 18:
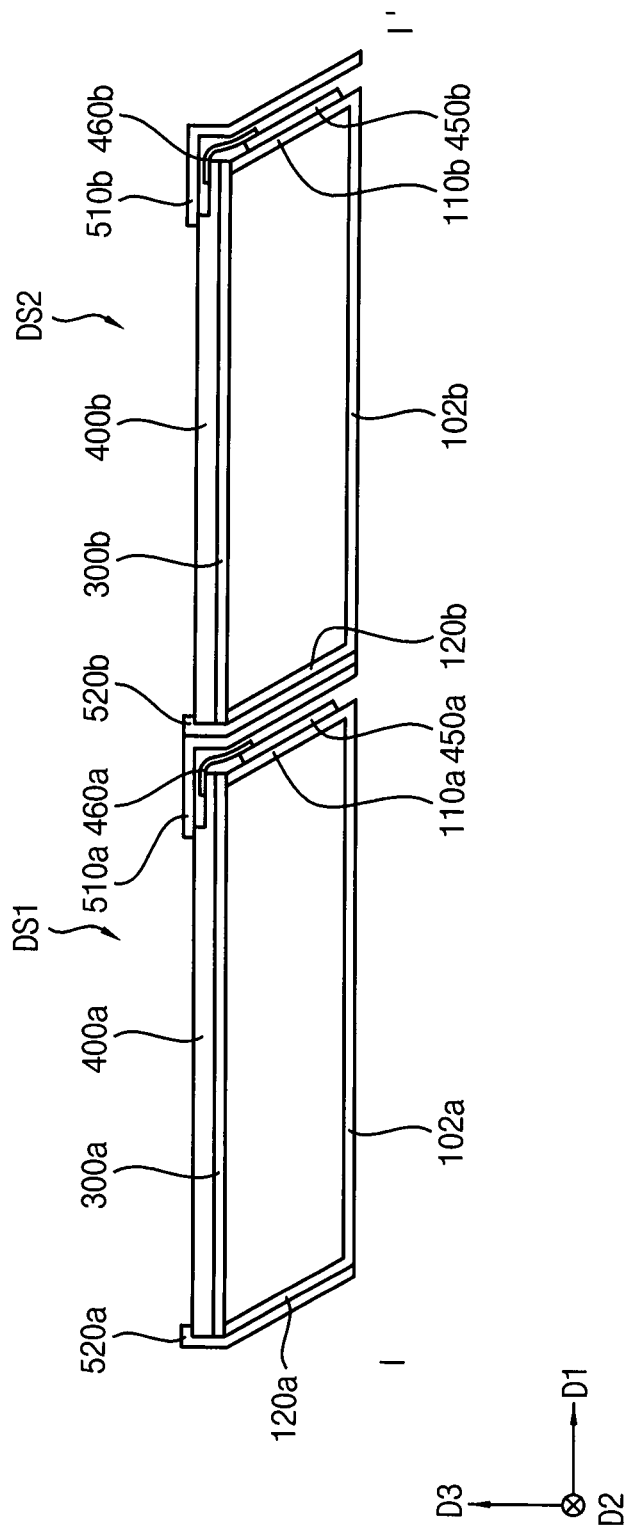
FIG. 18 is a cross-sectional view taken along line I-I' of FIG. 17.

FIG. 17 is a perspective view of a display apparatus according to an exemplary embodiment of the invention. FIG. 18 is a cross-sectional view taken along line I-I' of FIG. 17.

Referring to FIGS. 17 and 18, a display apparatus includes a first sub-display apparatus DS1, a second sub-display apparatus DS2, a third sub-display apparatus DS3 and a fourth sub-display apparatus DS4. Thus, the display apparatus may be a multi-screen display including a plurality of sub-display apparatuses. Each of the first to fourth sub display apparatuses DS1 to DS4 may be substantially same as one of the exemplary embodiments of the display apparatuses of FIGS. 1 to 16.

The second sub-display apparatus DS2 is disposed adjacent to the first sub-display apparatus DS1 in a first direction D1. The third sub-display apparatus DS3 is disposed adjacent to the first sub-display apparatus DS1 in a second direction D2 substantially perpendicular to the first direction D1. The fourth sub-display apparatus DS4 is adjacent to the second sub-display apparatus DS2 in the second direction D2, and adjacent to the third sub-display apparatus DS3 in the first direction D1. Thus, the sub-display apparatuses may be arranged in a matrix form.

Referring to FIG. 18, the first sub-display apparatus DS1 includes a top chassis, a bottom chassis, an optical element 300a, a display panel 400a, a driving substrate 450a, a connecting part 460a and a backlight assembly (not shown). The top chassis includes a first side surface 510a and a second side surface 520a. The bottom chassis includes a first side wall 110a, a first bottom plate 102a and a second side wall 120a.

The second sub-display apparatus DS2 includes a top chassis, a bottom chassis, an optical element 300b, a display panel 400b, a driving substrate 450b, a connecting part 460b and a backlight assembly (not shown). The top chassis includes a first side surface 510b and a second side surface 520b. The bottom chassis includes a first side wall 110b, a second bottom plate 102a and a second side wall 120b.

The first sub-display apparatus DS1 and the second sub-display apparatus DS2 are disposed adjacent each other in the first direction D1, so that the first side surface 510*a* of the first sub-display apparatus DS1 makes contact with the second side surface 520*b* of the second sub-display apparatus DS2. Thus, the driving substrate 450*a* of the first sub-display apparatus DS1 may be overlapped with the display panel 400*b* of the second sub-display apparatus DS2.

An angle between the driving substrate 450*a* of the first sub-display apparatus DS1 and the display panel 400*a* may be greater than about 90 degrees and less than about 180 degrees. Accordingly, a stress concentrated at the connecting part 460*a* may be decreased.

In addition, the driving substrate 450*a* of the first sub-display apparatus DS1 overlaps the display panel 400*b* of the second sub-display apparatus DS2, so that a bezel width where an image is not displayed between the display panel 400*a* of the first sub-display apparatus DS1 and the display panel 400*b* of the second sub-display apparatus DS2 may be decreased.

Figure 19:
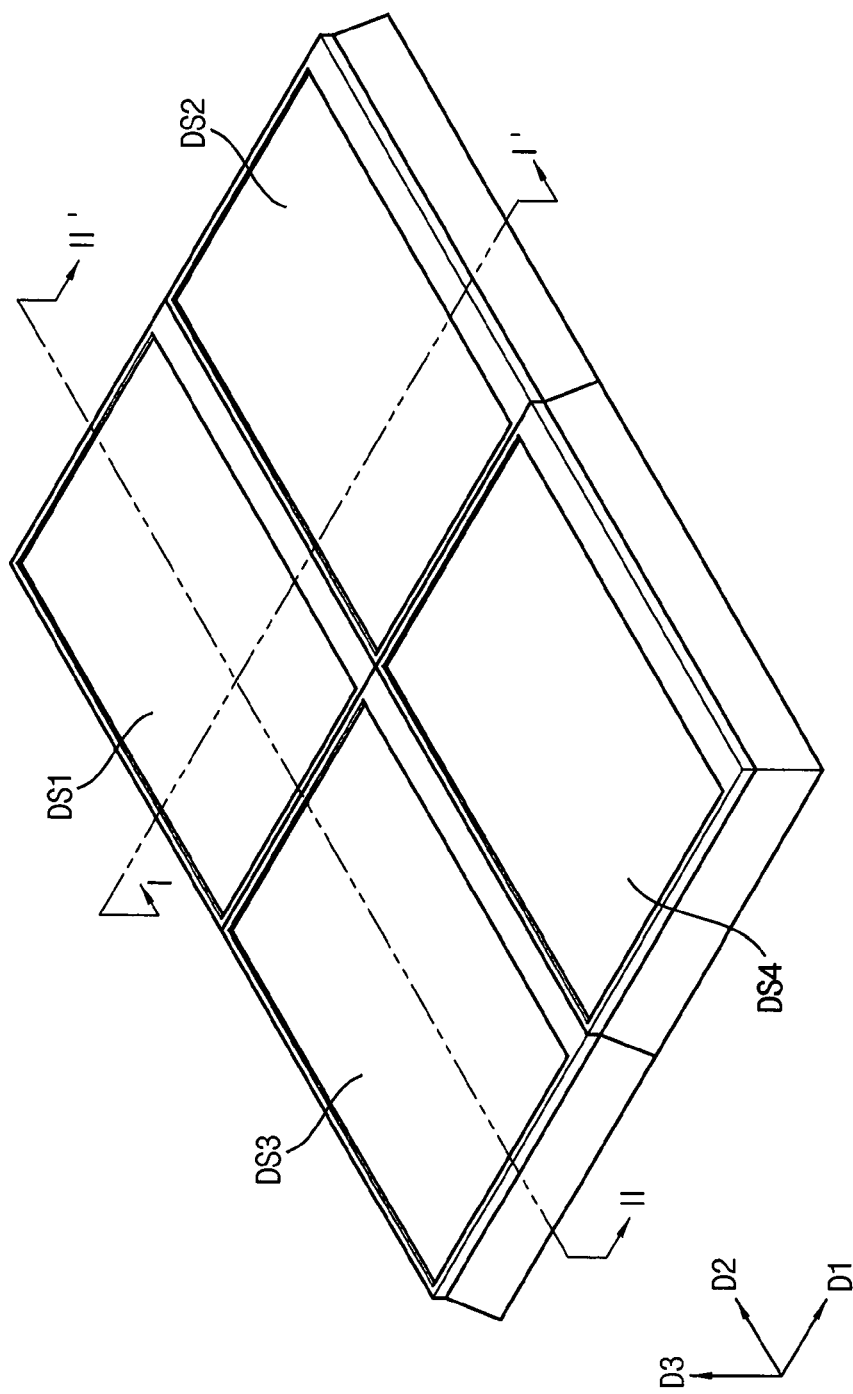
FIG. 19 is a perspective view of another exemplary embodiment of a display apparatus according to the invention.
Figure 20:
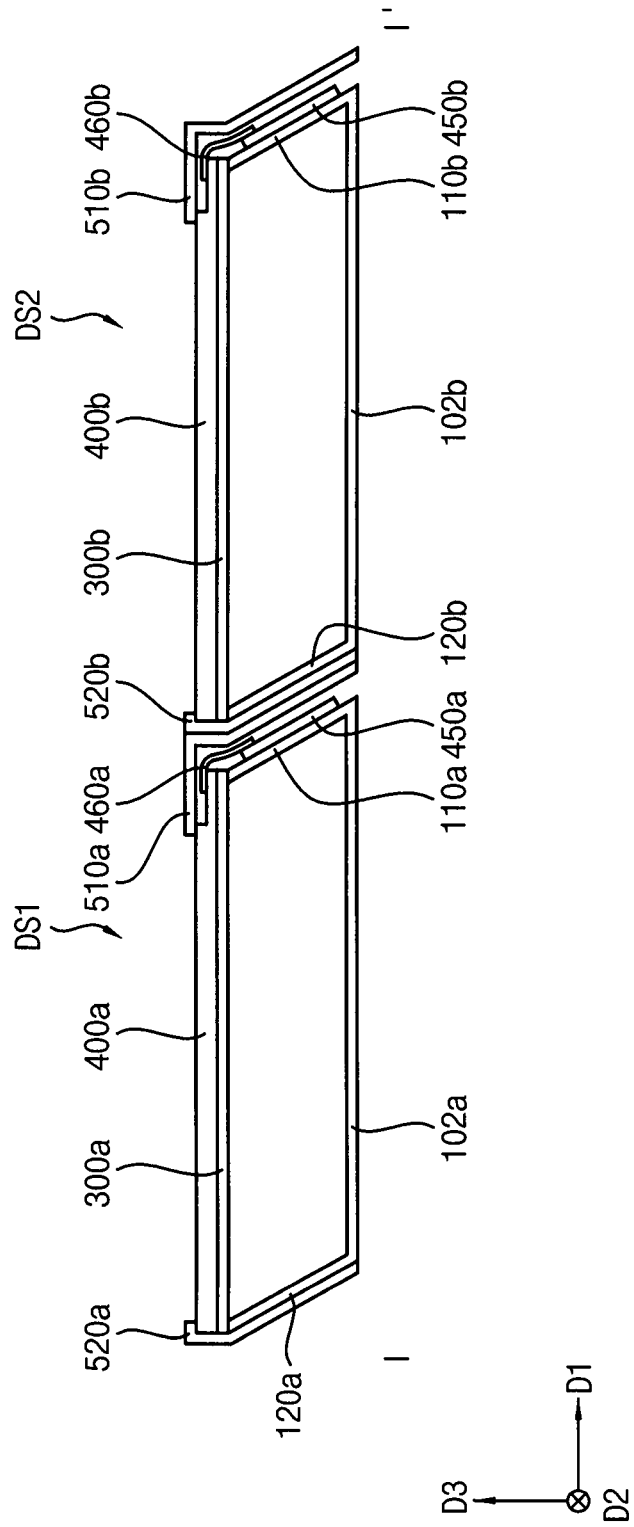
FIG. 20 is a cross-sectional view taken along line I-I' of FIG. 19.

FIG. 19 is a perspective view of a display apparatus according to another exemplary embodiment of the invention. FIG. 20 is a cross-sectional view taken along line I-I' of FIG. 19. FIG. 21 is a cross-sectional view taken along line II-II' of FIG. 19.

Referring to FIGS. 19 to 21, a display apparatus includes a first sub-display apparatus DS1, a second sub-display apparatus DS2, a third sub-display apparatus DS3 and a fourth sub-display apparatus DS4. Thus, the display apparatus may be a multi-screen display including a plurality of sub-display apparatuses. Each of the first to fourth sub display apparatuses DS1 to DS4 may be substantially same as one of display apparatuses of FIGS. 11 to 13.

The second sub-display apparatus DS2 is disposed adjacent to the first sub-display apparatus DS1 in a first direction D1. The third sub-display apparatus DS3 is disposed adjacent to the first sub-display apparatus DS1 in a second direction D2 substantially perpendicular to the first direction D1. The fourth sub-display apparatus DS4 is adjacent to the second sub-display apparatus DS2 in the second direction D2, and adjacent to the third sub-display apparatus DS3 in the first direction D1. Thus, the sub-display apparatuses may be arranged in a matrix form.

Referring to FIG. 20, the first sub-display apparatus DS1 includes a top chassis, a bottom chassis, an optical element 300*a*, a display panel 400*a*, a first driving substrate 450*a*, a first connecting part 460*a* and a backlight assembly (not shown). The top chassis includes a first side surface 510*a* and a second side surface 520*a*. The bottom chassis includes a first side wall 110*a* and a second side wall 120*a*.

The second sub-display apparatus DS2 includes a top chassis, a bottom chassis, an optical element 300*b*, a display panel 400*b*, a first driving substrate 450*b*, a first connecting part 460*b* and a backlight assembly (not shown). The top chassis includes a first side surface 510*b* and a second side surface 520*b*. The bottom chassis includes a first side wall 110*b* and a second side wall 120*b*.

The first sub-display apparatus DS1 and the second sub-display apparatus DS2 are disposed adjacent each other in the first direction D1, so that the first side surface 510*a* of the first sub-display apparatus DS1 makes contact with the second side surface 520*b* of the second sub-display apparatus DS2. Thus, the driving substrate 450*a* of the first sub-display apparatus DS1 may be overlapped with the display panel 400*b* of the second sub-display apparatus DS2. An angle between the first driving substrate 450*a* of the first sub-display apparatus DS1 and the display panel 400*a* may be greater than about 90 degrees and less than about 180 degrees.

Referring to FIG. 21, the first sub-display apparatus DS1 further includes third and fourth side surfaces 530*a* and 540*a* of the top chassis, a third side wall 130*a* and a fourth side wall 140*a*, a second driving substrate 470*a* and a second connecting part 480*a*.

The third sub-display apparatus DS3 includes a top chassis, a bottom chassis, an optical element 300*c*, a display panel including a lower substrate 410*c* and an upper substrate 420*c*, a second driving substrate 470*c*, a first connecting part 480*c* and a backlight assembly (not shown). The top chassis includes a third side surface 530*c* and a fourth side surface 540*c*. The bottom chassis includes a bottom plate 120*c*, a third side wall 130*c* and a fourth side wall 140*c*.

The first sub-display apparatus DS1 and the third sub-display apparatus DS3 are adjacent each other in the second direction D2, so that the third side surface 530*a* of the first sub-display apparatus DS1 makes contact with the fourth side surface 540*c* of the second sub-display apparatus DS2. Thus, the second driving substrate 470*a* of the first sub-display apparatus DS1 may be overlapped with the display panel of the third sub-display apparatus DS3. An angle between the second driving substrate 470*a* and the display panel including a lower substrate 410*a* and an upper substrate 420*a* of the first sub-display apparatus DS1 may be greater than about 90 degrees and less than about 180 degrees.

According to exemplary embodiment of the invention, a display panel includes a display panel and a driving substrate electrically connected to the display panel. An angle between the driving substrate and the display panel is greater than about 90 degrees and less than about 180 degrees, so that a stress concentrated at a connecting part which connecting the driving substrate to the display panel may be decreased.

In addition, a display panel includes a first sub-display apparatus and a second sub-display apparatus. A driving substrate of the first sub-display apparatus is overlapped with a display panel of the second sub-display apparatus, so that a bezel width where an image is not displayed between a display panel of the first sub-display apparatus and a display panel of the second sub-display apparatus may be decreased.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus comprising:
a display panel which displays an image;
a driving substrate which is disposed adjacent to the display panel in a first direction, and extends in a second direction substantially perpendicular to the first direction;
a connecting part connecting the display panel to the driving substrate; and
a receiving container which receives the display panel, the driving substrate and the connecting part,
wherein an angle between the display panel and the driving substrate is greater than about 90 degrees and less than about 180 degrees, and
wherein the receiving container comprises a bottom chassis and a top chassis,
the bottom chassis comprises a bottom plate, a first side wall extending from the bottom plate, and a second side wall which extends from the bottom plate and faces the first side wall,
the top chassis comprises a first side surface and a second side surface which faces the first side surface in the first direction, the first side surface comprises a first inclined surface, and the second side surface comprises a second inclined surface,
the first inclined surface of the top chassis, the driving substrate and the first side wall of the bottom chassis are in parallel with one another, and
the second inclined surface of the top chassis and the second side wall of the bottom chassis are in parallel with each other.

2. The display apparatus of claim 1, wherein an angle between the second side wall and the bottom plate of the bottom chassis is less than about 90 degrees.

3. The display apparatus of claim 1, wherein the driving substrate is disposed between the first inclined surface of the top chassis and the first side wall of the bottom chassis.

4. The display apparatus of claim 1, further comprising:
a mold frame which receives the display panel and is received in the receiving container,
wherein
the mold frame comprises a first mold side wall including a first mold inclined surface on which the driving substrate is disposed, and
the first mold inclined surface is in parallel with the first inclined surface of the top chassis.

5. The display apparatus of claim 4, wherein
a connecting groove which receives the connecting part is defined in the first mold side wall and
a protrusion disposed on the first inclined surface is provided on the first mold side wall and configured to support the driving substrate.

6. The display apparatus of claim 4, wherein the driving substrate is disposed between the first mold side wall of the mold frame and the first side surface of the top chassis.

7. The display apparatus of claim 1, wherein the display panel is exposed by the driving substrate in a plan view.

8. The display apparatus of claim 1, wherein the connecting part comprises:
a flexible printed circuit film which connects the display panel to the driving substrate; and
an integrated circuit chip disposed on the flexible printed circuit film.

9. The display apparatus of claim 1, further comprising:
a backlight assembly which is disposed under the display panel, received in the receiving container, and comprises a reflecting element including a first reflecting side wall and a light source part disposed on the reflecting element.

10. The display apparatus of claim 9, wherein the light source part comprises a light source driving substrate and a plurality of light emitting diode bars electrically connected to the light source driving substrate.

11. The display apparatus of claim 10, wherein
the reflecting element comprises a reflecting bottom surface, and a first reflecting side surface extending from the reflecting bottom surface and disposed adjacent to the driving substrate, and
the driving substrate is disposed in a space defined by the receiving container, the first reflecting side wall and the driving substrate.

* * * * *